(12) United States Patent
Chen et al.

(10) Patent No.: US 11,089,241 B2
(45) Date of Patent: Aug. 10, 2021

(54) PIXEL CELL WITH MULTIPLE PHOTODIODES

(71) Applicant: Facebook Technologies, LLC, Menlo Park, CA (US)

(72) Inventors: Song Chen, Redmond, WA (US); Xinqiao Liu, Medina, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/436,049

(22) Filed: Jun. 10, 2019

(65) Prior Publication Data

US 2019/0379844 A1 Dec. 12, 2019

Related U.S. Application Data

(60) Provisional application No. 62/683,573, filed on Jun. 11, 2018.

(51) Int. Cl.
*H04N 5/33* (2006.01)
*H04N 5/369* (2011.01)
*H01L 27/146* (2006.01)

(52) U.S. Cl.
CPC .............. *H04N 5/33* (2013.01); *H04N 5/369* (2013.01); *H01L 27/1461* (2013.01);
(Continued)

(58) Field of Classification Search
CPC ............. H01L 27/146; H01L 27/14638; H01L 27/14614; H01L 27/14621;
(Continued)

(56) References Cited

U.S. PATENT DOCUMENTS

| 4,596,977 A | 6/1986 | Bauman et al. |
| 5,053,771 A | 10/1991 | McDermott |

(Continued)

FOREIGN PATENT DOCUMENTS

| DE | 202016105510 | 10/2016 |
| EP | 0675345 | 10/1995 |

(Continued)

OTHER PUBLICATIONS

U.S. Appl. No. 16/454,787, Notice of Allowance dated Apr. 22, 2020, 10 pages.

(Continued)

*Primary Examiner* — Edemio Navas, Jr.
(74) *Attorney, Agent, or Firm* — Kilpatrick Townsend & Stockton

(57) ABSTRACT

In one example, a method comprises: transmitting a first signal to transfer a first portion of a first charge from a first photodiode to a first charge sensing unit to obtain a first measurement result and transmitting a second signal to transfer a second portion of the first charge from the first photodiode to a second charge sensing unit to obtain a second measurement result. The timing of transmission of the first signal and the second signal are based on the indirect time-of-flight measurement operation. The method further comprises performing the indirect time-of-flight measurement operation based on the first measurement result and the second measurement result; transmitting a third signal to transfer a second charge from a second photodiode to the second charge sensing unit via the first photodiode to obtain a third measurement result; and performing a D sensing operation based on the third measurement result.

24 Claims, 25 Drawing Sheets

(52) U.S. Cl.
CPC .. *H01L 27/14621* (2013.01); *H01L 27/14627* (2013.01); *H01L 27/14645* (2013.01); *H01L 27/14649* (2013.01); *H01L 27/14656* (2013.01)

(58) Field of Classification Search
CPC ......... H01L 27/14627; H01L 27/14629; H01L 27/14634; H01L 27/14645; H01L 27/14649; H01L 27/1463; H04N 9/045; H04N 9/04; H04N 5/33
USPC ..................................... 348/42–60, 135, 138
See application file for complete search history.

(56) References Cited

U.S. PATENT DOCUMENTS

| | | |
|---|---|---|
| 6,522,395 B1 | 2/2003 | Bamji et al. |
| 6,529,241 B1 | 3/2003 | Clark |
| 7,659,772 B2 | 2/2010 | Nomura et al. |
| 7,719,589 B2 | 5/2010 | Turchetta et al. |
| 8,134,623 B2 | 3/2012 | Purcell et al. |
| 8,144,227 B2 | 3/2012 | Kobayashi |
| 8,369,458 B2 | 2/2013 | Wong et al. |
| 8,426,793 B1 | 4/2013 | Barrows |
| 8,754,798 B2 | 6/2014 | Lin |
| 8,773,562 B1 | 7/2014 | Fan |
| 8,779,346 B2 | 7/2014 | Fowler et al. |
| 8,946,610 B2 | 2/2015 | Iwabuchi et al. |
| 9,094,629 B2 | 7/2015 | Ishibashi |
| 9,185,273 B2 | 11/2015 | Beck et al. |
| 9,274,151 B2 | 3/2016 | Lee et al. |
| 9,332,200 B1 | 5/2016 | Hseih et al. |
| 9,343,497 B2 | 5/2016 | Cho |
| 9,363,454 B2 | 6/2016 | Ito et al. |
| 9,478,579 B2 | 10/2016 | Dai et al. |
| 9,497,396 B2 | 11/2016 | Choi |
| 9,531,990 B1 | 12/2016 | Wilkins et al. |
| 9,800,260 B1 | 10/2017 | Banerjee |
| 9,819,885 B2 | 11/2017 | Furukawa et al. |
| 9,909,922 B2 | 3/2018 | Schweickert et al. |
| 9,948,316 B1 | 4/2018 | Yun et al. |
| 9,967,496 B2 | 5/2018 | Ayers et al. |
| 10,003,759 B2 | 6/2018 | Fan |
| 10,015,416 B2 | 7/2018 | Borthakur et al. |
| 10,419,701 B2 | 9/2019 | Liu |
| 10,574,925 B2 | 2/2020 | Otaka |
| 10,598,546 B2 | 3/2020 | Liu |
| 10,608,101 B2 | 3/2020 | Liu |
| 10,686,996 B2 | 6/2020 | Liu |
| 2002/0067303 A1 | 6/2002 | Lee et al. |
| 2003/0020100 A1 | 1/2003 | Guidash |
| 2003/0049925 A1 | 3/2003 | Layman et al. |
| 2004/0095495 A1 | 5/2004 | Inokuma et al. |
| 2004/0251483 A1 | 12/2004 | Ko et al. |
| 2005/0057389 A1 | 3/2005 | Krymski |
| 2005/0104983 A1 | 5/2005 | Raynor |
| 2005/0280727 A1 | 12/2005 | Sato et al. |
| 2006/0023109 A1 | 2/2006 | Mabuchi et al. |
| 2006/0158541 A1 | 7/2006 | Ichikawa |
| 2007/0013983 A1 | 1/2007 | Kitamura et al. |
| 2007/0076481 A1 | 4/2007 | Tennant |
| 2007/0092244 A1 | 4/2007 | Pertsel et al. |
| 2007/0102740 A1 | 5/2007 | Ellis-Monaghan et al. |
| 2007/0208526 A1 | 9/2007 | Staudt et al. |
| 2007/0222881 A1 | 9/2007 | Mentzer |
| 2008/0001065 A1 | 1/2008 | Ackland |
| 2008/0042046 A1 | 2/2008 | Mabuchi |
| 2008/0068478 A1 | 3/2008 | Watanabe |
| 2008/0088014 A1 | 4/2008 | Adkisson et al. |
| 2008/0191791 A1 | 8/2008 | Nomura et al. |
| 2008/0226183 A1 | 9/2008 | Lei et al. |
| 2009/0002528 A1 | 1/2009 | Manabe et al. |
| 2009/0066820 A1 | 3/2009 | Jiang et al. |
| 2009/0091645 A1 | 4/2009 | Trimeche et al. |
| 2009/0128640 A1 | 5/2009 | Yumiki |
| 2009/0224139 A1 | 9/2009 | Buettgen et al. |
| 2009/0244328 A1 | 10/2009 | Yamashita |
| 2009/0261235 A1 | 10/2009 | Lahav et al. |
| 2009/0303371 A1 | 12/2009 | Watanabe et al. |
| 2010/0013969 A1 | 1/2010 | Ui |
| 2010/0140732 A1 | 6/2010 | Eminoglu et al. |
| 2010/0276572 A1 | 11/2010 | Iwabuchi et al. |
| 2011/0049589 A1 | 3/2011 | Chuang et al. |
| 2011/0149116 A1 | 6/2011 | Kim |
| 2011/0254986 A1 | 10/2011 | Nishimura et al. |
| 2011/0298074 A1 | 12/2011 | Funao |
| 2012/0039548 A1 | 2/2012 | Wang et al. |
| 2012/0068051 A1 | 3/2012 | Ahn et al. |
| 2012/0092677 A1 | 4/2012 | Suehira et al. |
| 2012/0127284 A1 | 5/2012 | Bar-Zeev et al. |
| 2012/0133807 A1 | 5/2012 | Wu et al. |
| 2012/0138775 A1 | 6/2012 | Cheon et al. |
| 2012/0153123 A1 | 6/2012 | Mao et al. |
| 2012/0188420 A1 | 7/2012 | Black et al. |
| 2012/0241591 A1 | 9/2012 | Wan et al. |
| 2012/0262616 A1 | 10/2012 | Sa et al. |
| 2012/0267511 A1 | 10/2012 | Kozlowski |
| 2012/0273654 A1 | 11/2012 | Hynecek et al. |
| 2013/0020466 A1 | 1/2013 | Ayers et al. |
| 2013/0056809 A1 | 3/2013 | Mao et al. |
| 2013/0057742 A1 | 3/2013 | Nakamura et al. |
| 2013/0082313 A1 | 4/2013 | Manabe |
| 2013/0113969 A1 | 5/2013 | Manabe et al. |
| 2013/0120615 A1 | 5/2013 | Hirooka et al. |
| 2013/0126710 A1 | 5/2013 | Kondo |
| 2013/0141619 A1 | 6/2013 | Lim et al. |
| 2013/0207219 A1 | 8/2013 | Ahn |
| 2013/0214371 A1 | 8/2013 | Asatsuma et al. |
| 2013/0229543 A1 | 9/2013 | Hashimoto et al. |
| 2013/0229560 A1 | 9/2013 | Kondo |
| 2013/0234029 A1* | 9/2013 | Bikumandla ....... H01L 27/1464 250/349 |
| 2013/0248685 A1 | 9/2013 | Ann |
| 2013/0293752 A1 | 11/2013 | Peng et al. |
| 2013/0299674 A1 | 11/2013 | Fowler et al. |
| 2013/0300906 A1 | 11/2013 | Yan |
| 2014/0021574 A1 | 1/2014 | Egawa |
| 2014/0042299 A1 | 2/2014 | Wan et al. |
| 2014/0042582 A1 | 2/2014 | Kondo |
| 2014/0085523 A1 | 3/2014 | Hynecek |
| 2014/0176770 A1 | 6/2014 | Kondo |
| 2014/0211052 A1 | 7/2014 | Choi |
| 2014/0232890 A1 | 8/2014 | Yoo et al. |
| 2014/0306276 A1* | 10/2014 | Yamaguchi ............ H04N 5/372 257/292 |
| 2015/0048427 A1 | 2/2015 | Hu et al. |
| 2015/0083895 A1 | 3/2015 | Hashimoto et al. |
| 2015/0090863 A1 | 4/2015 | Mansoorian et al. |
| 2015/0172574 A1 | 6/2015 | Honda et al. |
| 2015/0189209 A1 | 7/2015 | Yang et al. |
| 2015/0208009 A1 | 7/2015 | Oh et al. |
| 2015/0229859 A1 | 8/2015 | Guidash et al. |
| 2015/0237274 A1 | 8/2015 | Yang et al. |
| 2015/0279884 A1 | 10/2015 | Kusumoto |
| 2015/0287766 A1 | 10/2015 | Kim et al. |
| 2015/0312502 A1 | 10/2015 | Borremans |
| 2015/0350582 A1 | 12/2015 | Korobov et al. |
| 2015/0358569 A1 | 12/2015 | Egawa |
| 2015/0358593 A1 | 12/2015 | Sato |
| 2015/0381907 A1 | 12/2015 | Boettiger et al. |
| 2016/0028974 A1 | 1/2016 | Guidash et al. |
| 2016/0028980 A1 | 1/2016 | Kameyama et al. |
| 2016/0035770 A1 | 2/2016 | Ann et al. |
| 2016/0037111 A1 | 2/2016 | Dai et al. |
| 2016/0088253 A1 | 3/2016 | Tezuka |
| 2016/0093659 A1 | 3/2016 | Nakamura et al. |
| 2016/0100115 A1 | 4/2016 | Kusano |
| 2016/0111457 A1 | 4/2016 | Sekine |
| 2016/0112626 A1 | 4/2016 | Shimada |
| 2016/0118992 A1 | 4/2016 | Milkov |
| 2016/0165160 A1 | 6/2016 | Hseih et al. |
| 2016/0204150 A1 | 7/2016 | Oh et al. |
| 2016/0225813 A1 | 8/2016 | Liao et al. |
| 2016/0240570 A1 | 8/2016 | Barna et al. |
| 2016/0249004 A1 | 8/2016 | Saeki et al. |

(56) References Cited

U.S. PATENT DOCUMENTS

| | | |
|---|---|---|
| 2016/0276394 A1 | 9/2016 | Chou et al. |
| 2016/0307945 A1 | 10/2016 | Madurawe |
| 2016/0337605 A1 | 11/2016 | Ito |
| 2016/0353045 A1 | 12/2016 | Kawahito et al. |
| 2016/0360127 A1 | 12/2016 | Dierickx et al. |
| 2017/0013215 A1 | 1/2017 | McCarten |
| 2017/0053962 A1 | 2/2017 | Oh et al. |
| 2017/0062501 A1 | 3/2017 | Velichko et al. |
| 2017/0069363 A1 | 3/2017 | Baker |
| 2017/0099446 A1 | 4/2017 | Cremers et al. |
| 2017/0104021 A1 | 4/2017 | Park et al. |
| 2017/0104946 A1 | 4/2017 | Hong |
| 2017/0111600 A1 | 4/2017 | Wang et al. |
| 2017/0141147 A1 | 5/2017 | Raynor |
| 2017/0170223 A1 | 6/2017 | Hynecek et al. |
| 2017/0207268 A1 | 7/2017 | Kurokawa |
| 2017/0346579 A1 | 11/2017 | Barghi |
| 2017/0359497 A1 | 12/2017 | Mandelli et al. |
| 2017/0366766 A1 | 12/2017 | Geurts et al. |
| 2018/0019269 A1 | 1/2018 | Klipstein |
| 2018/0077368 A1 | 3/2018 | Suzuki |
| 2018/0152650 A1 | 5/2018 | Sakakibara et al. |
| 2018/0213205 A1 | 7/2018 | Oh |
| 2018/0220093 A1 | 8/2018 | Murao et al. |
| 2018/0286896 A1 | 10/2018 | Kim et al. |
| 2018/0376046 A1 | 12/2018 | Liu |
| 2019/0052788 A1 | 2/2019 | Liu |
| 2019/0056264 A1 | 2/2019 | Liu |
| 2019/0057995 A1 | 2/2019 | Liu |
| 2019/0058058 A1 | 2/2019 | Liu |
| 2019/0104263 A1 | 4/2019 | Ochiai et al. |
| 2019/0104265 A1 | 4/2019 | Totsuka et al. |
| 2019/0157330 A1 | 5/2019 | Sato et al. |
| 2019/0172868 A1 | 6/2019 | Chen et al. |
| 2019/0335151 A1 | 10/2019 | Rivard et al. |
| 2019/0348460 A1* | 11/2019 | Chen ............... H01L 27/14614 |
| 2019/0355782 A1 | 11/2019 | Do et al. |
| 2019/0379827 A1 | 12/2019 | Berkovich et al. |
| 2020/0007800 A1 | 1/2020 | Berkovich et al. |
| 2020/0068189 A1 | 2/2020 | Chen et al. |

FOREIGN PATENT DOCUMENTS

| | | | |
|---|---|---|---|
| EP | 1681856 | 7/2006 | |
| EP | 1732134 | 12/2006 | |
| EP | 1746820 | 1/2007 | |
| EP | 2063630 | 5/2009 | |
| EP | 2538664 | 12/2012 | |
| EP | 2833619 | 2/2015 | |
| EP | 3032822 | 6/2016 | |
| EP | 3258683 | 12/2017 | |
| EP | 3425352 | 1/2019 | |
| KR | 100574959 | 4/2006 | |
| KR | 20110050351 | 5/2011 | |
| KR | 20150095841 | 8/2015 | |
| KR | 20160008287 | 1/2016 | |
| WO | 2017058488 | 4/2017 | |
| WO | 2017069706 | 4/2017 | |
| WO | WO-2017069706 A1 * | 4/2017 | ............ H01L 31/12 |
| WO | 2017169882 | 10/2017 | |
| WO | 2019168929 | 9/2019 | |

OTHER PUBLICATIONS

Cho et al., Low Power Dual CDS for a Column-Parallel CMOS Image Sensor, JSTS: Journal of Semiconductor Technology and Science, vol. 12, No. 4, Dec. 30, 2012, pp. 388-396.

Kavusi et al., Quantitative Study of High-Dynamic-Range Image Sensor Architectures, Proceedings of SPIE, The International Society for Optical Engineering, vol. 5301, Jun. 7, 2004, pp. 264-275.

International Application No. PCT/US2019/035724, International Search Report and Written Opinion dated Sep. 10, 2019, 12 pages.

International Application No. PCT/US2019/036484, International Search Report and Written Opinion dated Sep. 19, 2019, 10 pages.

International Application No. PCT/US2019/036492, International Search Report and Written Opinion dated Sep. 25, 2019, 9 pages.

International Application No. PCT/US2019/036536, International Search Report and Written Opinion dated Sep. 26, 2019, 14 pages.

International Application No. PCT/US2019/039410, International Search Report and Written Opinion dated Sep. 30, 2019, 11 pages.

International Application No. PCT/US2019/039758, International Search Report and Written Opinion dated Oct. 11, 2019, 13 pages.

International Application No. PCT/US2019/047156, International Search Report and Written Opinion dated Oct. 23, 2019, 9 pages.

International Application No. PCT/US2019/048241, International Search Report and Written Opinion dated Jan. 28, 2020, 16 pages.

Snoeij, A Low Power Column-Parallel 12-Bit ADC for CMOS Imagers, Proceedings IEEE Workshop on Charge-Coupled Devices Andadvanced Image Sensors (CCDS & AIS), IEEE, Jun. 1, 2005, pp. 169-172.

U.S. Appl. No. 16/431,693, "Non-Final Office Action", dated Jan. 30, 2020, 6 pages.

U.S. Appl. No. 15/668,241, "Advisory Action", dated Oct. 23, 2019, 5 pages.

U.S. Appl. No. 15/668,241, "Final Office Action", dated Jun. 17, 2019, 19 pages.

U.S. Appl. No. 15/668,241, "Non-Final Office Action", dated Dec. 21, 2018, 3 pages.

U.S. Appl. No. 15/668,241, "Notice of Allowance", dated Jun. 29, 2020, 8 pages.

U.S. Appl. No. 15/668,241, "Notice of Allowance", dated Mar. 5, 2020, 8 pages.

U.S. Appl. No. 15/668,241, "Supplemental Notice of Allowability", dated Apr. 29, 2020, 5 pages.

U.S. Appl. No. 15/719,345, "Final Office Action", dated Apr. 29, 2020, 14 pages.

U.S. Appl. No. 15/719,345, "Non- Final Office Action", dated Nov. 25, 2019, 14 pages.

U.S. Appl. No. 15/719,345, "Notice of Allowance", dated Aug. 12, 2020, 11 pages.

U.S. Appl. No. 15/847,517, "Notice of Allowance", dated May 1, 2019, 11 pages.

U.S. Appl. No. 15/861,588, "Non-Final Office Action", dated Jul. 10, 2019, 11 pages.

U.S. Appl. No. 15/861,588, "Notice of Allowance", dated Nov. 26, 2019, 9 pages.

U.S. Appl. No. 15/876,061, "Corrected Notice of Allowability", dated Apr. 28, 2020, 3 pages.

U.S. Appl. No. 15/876,061, "Non-Final Office Action", dated Sep. 18, 2019, 23 pages.

U.S. Appl. No. 15/876,061, "Notice of Allowability", dated May 6, 2020, 2 pages.

U.S. Appl. No. 15/876,061, "Notice of Allowance", dated Feb. 4, 2020, 13 pages.

U.S. Appl. No. 15/927,896, "Non-Final Office Action", dated May 1, 2019, 10 pages.

U.S. Appl. No. 15/983,379, "Notice of Allowance", dated Oct. 18, 2019, 9 pages.

U.S. Appl. No. 15/983,391, "Non-Final Office Action", dated Aug. 29, 2019, 12 pages.

U.S. Appl. No. 15/983,391, "Notice of Allowance", dated Apr. 8, 2020, 8 pages.

U.S. Appl. No. 16/177,971, "Final Office Action", dated Feb. 27, 2020, 9 pages.

U.S. Appl. No. 16/177,971, "Non-Final Office Action", dated Sep. 25, 2019, 9 pages.

U.S. Appl. No. 16/177,971, "Notice of Allowance", dated Apr. 24, 2020, 6 pages.

U.S. Appl. No. 16/249,420, "Non-Final Office Action", dated Jul. 22, 2020, 9 pages.

U.S. Appl. No. 16/286,355, "Non-Final Office Action", dated Oct. 1, 2019, 6 pages.

U.S. Appl. No. 16/286,355, "Notice of Allowance", dated Feb. 12, 2020, 7 pages.

U.S. Appl. No. 16/286,355, "Notice of Allowance", dated Jun. 4, 2020, 7 pages.

(56) References Cited

OTHER PUBLICATIONS

U.S. Appl. No. 16/369,763, "Non-Final Office Action", dated Jul. 22, 2020, 15 pages.
U.S. Appl. No. 16/382,015, "Notice of Allowance", dated Jun. 11, 2020, 11 pages.
U.S. Appl. No. 16/431,693, "Notice of Allowance", dated Jun. 24, 2020, 7 pages.
U.S. Appl. No. 16/454,787, "Notice of Allowance", dated Jul. 9, 2020, 9 pages.
U.S. Appl. No. 16/566,583, "Final Office Action", dated Apr. 15, 2020, 24 pages.
U.S. Appl. No. 16/566,583, "Non-Final Office Action", dated Oct. 1, 2019, 10 pages.
U.S. Appl. No. 16/566,583, "Non-Final Office Action", dated Jul. 27, 2020, 11 pages.
EP18179838.0, "Extended European Search Report", dated May 24, 2019, 17 pages.
EP18188684.7, "Extended European Search Report", dated Jan. 16, 2019, 10 pages.
EP18188684.7, "Office Action", dated Nov. 26, 2019, 9 pages.
EP18188968.4, "Extended European Search Report", dated Oct. 23, 2018, 8 pages.
EP18188968.4, "Office Action", dated Aug. 14, 2019, 5 pages.
EP18189100.3, "Extended European Search Report", dated Oct. 9, 2018, 8 pages.
PCT/US2018/039350, "International Preliminary Report on Patentability", dated Jan. 9, 2020, 10 pages.
PCT/US2018/039350, "International Search Report and Written Opinion", dated Nov. 15, 2018, 13 pages.
PCT/US2018/045661, "International Search Report and Written Opinion", dated Nov. 30, 2018, 11 Pages.
PCT/US2018/045666, "International Preliminary Report on Patentability", dated Feb. 27, 2020, 11 pages.
PCT/US2018/045666, "International Search Report and Written Opinion", dated Dec. 3, 2018, 13 pages.
PCT/US2018/046131, "International Search Report and Written Opinion", dated Dec. 3, 2018, 10 pages.
PCT/US2018/064181, "International Preliminary Report on Patentability", dated Jun. 18, 2020, 9 pages.
PCT/US2019/014044, "International Search Report and Written Opinion", dated May 8, 2019, 11 pages.
PCT/US2019/019756, "International Search Report and Written Opinion", dated Jun. 13, 2019, 11 pages.
PCT/US2019/025170, "International Search Report and Written Opinion", dated Jul. 9, 2019, 11 pages.
PCT/US2019/027727, "International Search Report and Written Opinion", dated Jun. 27, 2019, 11 pages.
PCT/US2019/027729, "International Search Report and Written Opinion", dated Jun. 27, 2019, 10 pages.
PCT/US2019/036575, "International Search Report and Written Opinion", dated Sep. 30, 2019, 16 pages.
PCT/US2019/065430, "International Search Report and Written Opinion", dated Mar. 6, 2020, 15 pages.
Tanner et al., "Low-Power Digital Image Sensor for Still Picture Image Acquisition", Visual Communications and Image Processing, vol. 4306, Jan. 22, 2001, 8 pages.
Cho et al., "A Low Power Dual CDS for a Column-Parallel Cmos Image Sensor", Journal of Semiconductor Technology and Science, vol. 12, No. 4, Dec. 30, 2012, 9 pages.
Xu et al., "A New Digital-Pixel Architecture for CMOS Image Sensor With Pixel-Level ADC and Pulse Width Modulation using a 0.18 Mu M CMOS Technology", Institute of Electrical and Electronics Engineers Conference on Electron Devices and Solid-State Circuits, Dec. 16-18, 2003, pp. 265-268.
U.S. Appl. No. 15/801,216, "Advisory Action", dated Apr. 7, 2020, 3 pages.
U.S. Appl. No. 15/801,216, "Final Office Action", dated Dec. 26, 2019, 5 pages.
U.S. Appl. No. 15/801,216, "Non-Final Office Action", dated Jun. 27, 2019, 13 pages.
U.S. Appl. No. 15/801,216, "Notice of Allowance", dated Jun. 23, 2020, 5 pages.
U.S. Appl. No. 15/847,517, "Non-Final Office Action", dated Nov. 23, 2018, 21 pages.
U.S. Appl. No. 16/210,748, "Final Office Action", dated Jul. 7, 2020, 11 pages.
U.S. Appl. No. 16/210,748, "Non-Final Office Action", dated Jan. 31, 2020, 11 pages.
U.S. Appl. No. 16/384,720, "Non-Final Office Action", dated May 1, 2020, 6 pages.
U.S. Appl. No. 16/384,720, "Notice of Allowance", dated Aug. 26, 2020, 8 pages.
U.S. Appl. No. 16/435,449, "Notice of Allowance", dated Jul. 27, 2020, 8 pages.
EP18179838.0, "Partial European Search Report", dated Dec. 5, 2018, 14 pages.
EP18179846.3, "Extended European Search Report", dated Dec. 7, 2018, 10 pages.
EP18179851.3, "Extended European Search Report", dated Dec. 7, 2018, 8 pages.
EP18188962.7, "Extended European Search Report", dated Oct. 23, 2018, 8 pages.
EP18188962.7, "Office Action", dated Aug. 28, 2019, 6 pages.
PCT/US2018/039352, "International Search Report and Written Opinion", dated Oct. 26, 2018, 10 pages.
PCT/US2018/039431, "International Search Report and Written Opinion", dated Nov. 7, 2018, 14 pages.
PCT/US2018/045673, "International Search Report and Written Opinion", dated Dec. 4, 2018, 13 pages.
PCT/US2018/064181, "International Search Report and Written Opinion", dated Mar. 29, 2019, 12 pages.
PCT/US2019/031521, "International Search Report and Written Opinion", dated Jul. 11, 2019, 11 pages.
PCT/US2019/049756, "International Search Report and Written Opinion", dated Dec. 16, 2019, 8 pages.
PCT/US2019/059754, "International Search Report and Written Opinion", dated Mar. 24, 2020, 15 pages.
U.S. Appl. No. 16/407,072, "Non-Final Office Action", dated Dec. 24, 2020, 15 pages.
U.S. Appl. No. 16/672,427, "Non Final Office Action", dated Dec. 7, 2020, 8 pages.
U.S. Appl. No. 16/560,665, "Non-Final Office Action", dated Apr. 29, 2021, 17 pages.
Notice of Allowance for U.S. Appl. No. 16/407,072, dated Jun. 1, 2021, 11 pages.

\* cited by examiner

PIXEL CELL WITH MULTIPLE PHOTODIODES

RELATED APPLICATIONS

This patent application claims priority to U.S. Provisional Patent Application Ser. No. 62/683,573, filed Jun. 11, 2018, entitled "PIXEL WITH STACKED DUAL PHOTODIODES FOR TIME-OF-FLIGHT DEPTH SENSING," which is assigned to the assignee hereof and are incorporated herein by reference in their entirety for all purposes.

BACKGROUND

The disclosure relates generally to image sensors, and more specifically to a pixel cell that includes multiple photodiodes.

A typical pixel cell in an image sensor includes a photodiode to sense incident light by converting photons into charge (e.g., electrons or holes). The charge can be temporarily stored in photodiode during an exposure period. For improved noise and dark current performances, a pinned photodiode can be included in the pixel to convert the photons into charge. The pixel cell may further include a capacitor (e.g., a floating diffusion) to collect the charge from the photodiode and to convert the charge to a voltage. An image sensor typically includes an array of pixel cells. The pixel cells can be configured to detect light of different wavelength ranges to generate 2D and/or 3D image data.

SUMMARY

The present disclosure relates to image sensors. More specifically, and without limitation, this disclosure relates to a pixel cell configured to perform 2D and 3D sensing.

In one example, an apparatus comprises: a first photodiode; a second photodiode, a first charge sensing unit, a second charge sensing unit, a first polysilicon gate, a second polysilicon gate, and a controller. The controller is configured to: enable the first photodiode to generate a first charge; enable the second photodiode to generate a second charge; transmit, via the first polysilicon gate, a first signal to transfer a first portion of the first charge from the first photodiode to the first charge sensing unit to obtain a first measurement result, a timing of transmission of the first signal being based on an indirect time-of-flight measurement operation; transmit, via the second polysilicon gate, a second signal to transfer a second portion of the first charge from the first photodiode to the second charge sensing unit to obtain a second measurement result, a timing of transmission of the second signal being based on the indirect time-of-flight measurement operation; perform the indirect time-of-flight measurement operation based on the first measurement result and the second measurement result; transmit, via the second polysilicon gate, a third signal to transfer the second charge from the second photodiode to the second charge sensing unit via the first photodiode to obtain a third measurement result; and perform a 2D sensing operation based on the third measurement result.

In some aspects, the first photodiode and the second photodiode are in a semiconductor substrate having a front side surface. The semiconductor substrate comprises: a first drain region configured as the first charge sensing unit, a first channel region connected between the first drain region and the first photodiode, a second drain region configured as the second charge sensing unit; and a second channel region connected between the second drain region and the second photodiode. The first polysilicon gate and the second polysilicon gate are on the front side surface and over, respectively, the first channel region and the second channel region.

In some aspects, the first photodiode comprises a pinning layer. The pinning layer is connected to the first channel region and the second channel region.

In some aspects, the first polysilicon gate extends over a first region of the first photodiode connected to the first channel region. The second polysilicon gate extends over a second region of the first photodiode connected to the second channel region. The first signal is configured to modulate electrical potentials of the first region of the first photodiode and of the first channel region. The second signal is configured to modulate electrical potentials of the second region of the first photodiode and of the second channel region.

In some aspects, the apparatus further comprises: a third drain region configured as a third charge sensing unit to measure a third portion of the first charge; a third channel region connected between the third drain region and the first photodiode; and a third polysilicon gate on the front side surface and over the third channel region to transmit a fourth signal to transfer the third portion of the first charge to the third drain region via the third channel region. The controller is configured to control a timing of transmission of the fourth signal based on the indirect time-of-flight measurement operation and to perform the indirect time-of-flight measurement operation based on the third portion of the first charge.

In some aspects, the apparatus further comprises: a fourth drain region configured as a charge sink to reset at least one of the first photodiode or the second photodiode, a fourth channel region connected between the fourth drain region and the first photodiode, and a fourth polysilicon gate on the front side surface and over the fourth channel region to transmit a fifth signal to reset the first photodiode.

In some aspects, the apparatus further comprises a barrier layer sandwiched between the first photodiode and the second photodiode. The barrier layer is configured to block the first charge from flowing into the second photodiode and is controllable by a sixth signal to control a flow of the second charge from the second photodiode to the first photodiode.

In some aspects, the apparatus further comprises an infra-red illuminator to transmit a first infra-red light pulse. The first photodiode is configured to generate the first charge based on detecting a second infra-red light pulse from reflection of the first infra-red light pulse. The controller is configured to control the infra-red illuminator to transmit the first infra-red light pulse between a first time and a second time, and synchronize the timing of transmission of the first signal and the second signal based on the second time to measure a phase difference between the first infra-red light pulse and the second infra-red light pulse for the indirect time-of-flight measurement operation.

In some aspects, the controller is configured to: stop the transmission of the first signal at the second time to measure, based on the first portion of the first charge, a first width of the second infra-red light pulse before the second time; start the transmission of the second signal at the second time to measure, based on the second portion of the first charge, a second width of the second infra-red light pulse after the second time; and determine the phase difference based on a ratio between the second width and a total width of the second infra-red light pulse, and based on a width of the first infra-red light pulse.

In some aspects, the controller is configured to: transmit the fourth signal to measure, based on the third portion of the first charge, an ambient infra-red light; measure, based on a first difference between the first portion of the first charge and the third portion of the first charge, the first width of the second infra-red light pulse before the second time; and measure, based on a second difference between the second portion of the first charge and the third portion of the first charge, the second width of the second infra-red light pulse before the second time.

In some aspects, the controller is configured to transmit the fifth signal to reset the first photodiode before and after the transmission of the first signal and the second signal.

In some aspects, the second photodiode is configured to generate the second charge based on detecting visible light. The controller is configured to: transmit the fifth signal to reset the first photodiode; and transmit the sixth signal and the third signal to transfer the second charge from the second photodiode to the second drain region via the reset first photodiode.

In some aspects, the controller is configured to obtain the third measurement result of the visible light based on the second charge and a first infra-red crosstalk component introduced by the second infra-red light pulse, the first infra-red crosstalk component being based on the first charge and a ratio between a spectral response of the first photodiode and a spectral response of the second photodiode within a frequency range of the first infra-red light pulse.

In some aspects, the controller is configured to generate the measurement of the visible light based on a second infra-red crosstalk component introduced by the ambient infra-red light.

In some aspects, the first infra-red crosstalk component and the second infra-red crosstalk component are determined based on the width of the first infra-red light pulse and an integration period in which the second photodiode generates the second charge in response to the visible light.

In one example, a method comprises: enabling a first photodiode to generate a first charge; enabling a second photodiode to generate a second charge; transmitting a first signal to transfer a first portion of the first charge from the first photodiode to a first charge sensing unit to obtain a first measurement result, a timing of transmission of the first signal being based on an indirect time-of-flight measurement operation; transmitting a second signal to transfer a second portion of the first charge from the first photodiode to a second charge sensing unit to obtain a second measurement result, a timing of transmission of the second signal being based on the indirect time-of-flight measurement operation; performing the indirect time-of-flight measurement operation based on the first measurement result and the second measurement result; transmitting a third signal to transfer the second charge from the second photodiode to the second charge sensing unit via the first photodiode to obtain a third measurement result; and performing a 2D sensing operation based on the third measurement result.

In some aspects, the first signal is transmitted to modulate an electrical potential of a first region of the first photodiode. The second signal is transmitted to modulate an electrical potential of a second region of the first photodiode.

In some aspects, the method further comprises: controlling an infra-red illuminator to transmit a first infra-red light pulse between a first time and a second time; enabling the first photodiode to generate the first charge based on detecting a second infra-red light pulse from reflection of the first infra-red light pulse within an integration period; and synchronizing the timing of transmission of the first signal and the second signal based on the second time to measure a phase difference between the first infra-red light pulse and the second infra-red light pulse for the indirect time-of-flight measurement operation.

In some aspects, the method further comprises: stopping the transmission of the first signal at the second time to measure, based on the first portion of the first charge, a first width of the second infra-red light pulse before the second time; starting the transmission of the second signal at the second time to measure, based on the second portion of the first charge, a second width of the second infra-red light pulse after the second time; and determining the phase difference based on a ratio between the second width and a total width of the second infra-red light pulse, and based on a width of the first infra-red light pulse.

In some aspects, the method further comprises: transmitting a fourth signal to transfer a third portion of the first charge from the first photodiode to a third charge sensing unit, the third portion of the first charge being generated by the first photodiode in response to an ambient infra-red light; measuring, based on a difference between the first portion of the first charge and the third portion of the first charge, the first width of the second infra-red light pulse before the second time; and measuring, based on a difference between the second portion of the first charge and the third portion of the first charge, the second width of the second infra-red light pulse before the second time.

BRIEF DESCRIPTION OF THE DRAWINGS

Illustrative embodiments are described with reference to the following figures.

Figure 1A:
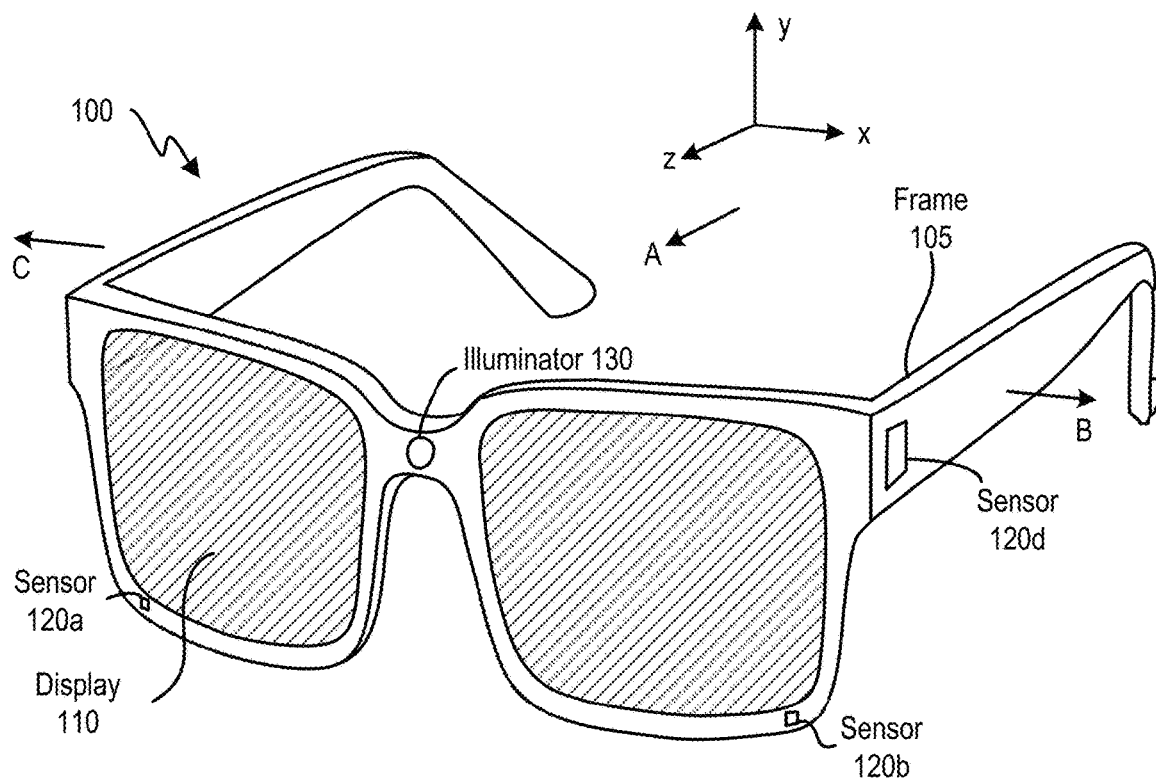
FIG. 1A and FIG. 1B are diagrams of an embodiment of a near-eye display.
Figure 1A:
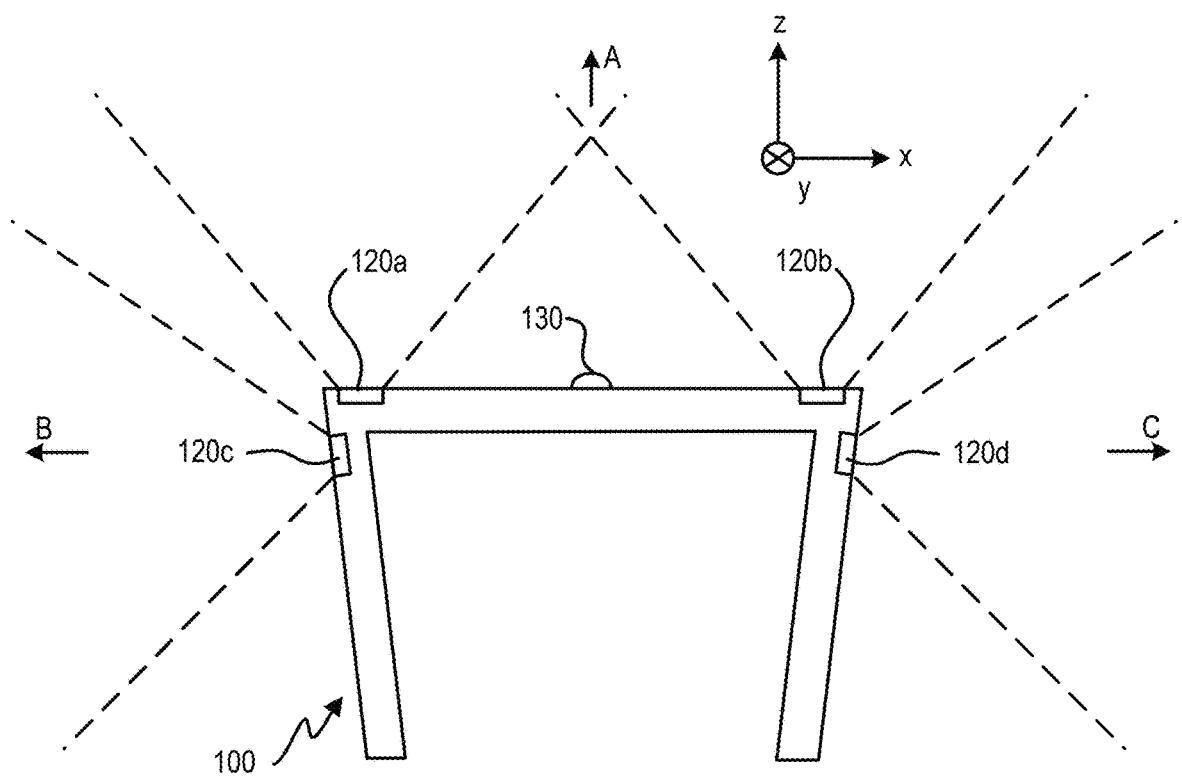

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of certain inventive embodiments. However, it will be apparent that various embodiments may be practiced without these specific details. The figures and description are not intended to be restrictive.

A typical image sensor typically includes an array of pixel cells. Each pixel cell may have a photodiode to sense incident light by converting photons into charge (e.g., electrons or holes). For improved noise and dark current performances, a pinned photodiode can be included in the pixel to convert the photons into charge. The charge can be sensed by a charge sensing device, such as a floating drain region and/or other capacitors, which can convert the charge to a voltage. A pixel value can be generated based on the voltage. The pixel value can represent an intensity of light received by the pixel cell. An image comprising an array of pixels can be derived from the digital outputs of the voltages output by an array of pixel cells.

An image sensor can be used to perform different modes of imaging, such as 2D and 3D sensing. The 2D and 3D sensing can be performed based on light of different wavelength ranges. For example, visible light can be used for 2D sensing, whereas invisible light (e.g., infra-red light) can be used for 3D sensing. An image sensor may include an optical filter array to allow visible light of different optical wavelength ranges and colors (e.g., red, green, and blue colors) to a first set of pixel cells assigned for 2D sensing, and invisible light to a second set of pixel cells assigned for 3D sensing.

To perform 2D sensing, a photodiode at a pixel cell can generate charge at a rate that is proportional to an intensity of visible light incident upon the pixel cell, and the quantity of charge accumulated in an exposure period can be used to represent the intensity of visible light (or a certain color component of the visible light). The charge can be stored temporarily at the photodiode and then transferred to a capacitor (e.g., a floating diffusion) to develop a voltage. The voltage can be sampled and quantized by an analog-to-digital converter (ADC) to generate an output corresponding to the intensity of visible light. An image pixel value can be generated based on the outputs from multiple pixel cells configured to sense different color components of the visible light (e.g., red, green, and blue colors).

Moreover, to perform 3D sensing, such as performing a depth sensing operation of an object with respect to the pixel cell, an illuminator can transmit light of a different wavelength range (e.g., infra-red light) onto an object, and the reflected light can be detected by the photodiode at the pixel cell. The light can include one or more light pulses, etc. The pixel cell output can be used to perform depth sensing operations based on, for example, measuring a time-of-flight (ToF) of the light pulses from the illuminator to the object and from the object back to the pixel cell. Based on the speed of light and the time-of-flight, a distance of the flight path of the light pulses, which corresponds to the depth of the object with respect to the pixel cell and the object, can be determined.

ToF measurements can be classified into two classes: a direct time-of-flight measurement and an indirect ToF measurement. Direct ToF measurement can directly measure a time difference between a transmitted infra-red light pulse and a reflected infra-red light pulse. The ToF can be measured based on a time difference between the time of transmission of the infra-red light pulse and the time of detection of the first photon of the reflected infra-red light pulse. The transmitted light pulse typically has a very short pulse width. Moreover, the photodiode of the pixel cell can operate in a Geiger mode. In a Geiger mode, an avalanche photocurrent can be triggered upon the photodiode detecting the first photon of the reflected infra-red light pulse, and a detection signal having a very sharp transition can be generated at the charge sensing unit to indicate the time of detection of the first photon. To improve the resolution of a direct ToF measurement, typically the infra-red light pulse being transmitted needs to have a short pulse width in the order of nanoseconds (ns), but the generation of pulses with such a short pulse width typically requires high precision and high power circuits to concentrate the transmission power within a very short duration of transmission time, which may be difficult to implement. Moreover, the photodiode operating in Geiger mode can be triggered by background infra-red light not due to the reflection of the infra-red light pulse, which may limit the direct ToF measurement in environments with very low background infra-red light signal.

In the indirect time-of-flight measurement, the illuminator can transmit modulated light signals, which can include a sequence of periodic light signals. The light signals can include light pulses, continuous sinusoidal signals, etc. The modulated light signals can be reflected off the object to become modulated reflected light. The ToF can be measured based on a phase difference between modulated transmitted light signals and the modulated reflected light signals. The phase difference can represent a time difference between transitions of the modulated transmitted light signals and transitions of the modulated reflected light signals. Compared with direct ToF, indirect ToF measurement measures a phase difference and can have relaxed requirement for the pulse width. Moreover, the photodiode needs not operate in Geiger mode to detect the first photon, which makes the ToF measurement operation less sensitive to background infra-red light signal. Although the indirect ToF measurement has a relaxed requirement for the transmitted signals, the modulations of the transmitted signals and the reflected signals still needs to at a relatively high speed to reduce the transition times of the modulated light signals, to provide a more accurate measurement of the phase difference and the TOF.

A pixel cell array can be used to generate information of a scene. In some examples, a subset (e.g., a first set) of the pixel cells within the array can be used to perform 2D sensing of the scene, and another subset (e.g., a second set) of the pixel cells within the array can be used to perform 3D sensing of the scene. The fusion of 2D and 3D imaging data are useful for many applications that provide virtual-reality (VR), augmented-reality (AR) and/or mixed reality (MR) experiences. For example, a wearable VR/AR/MR system may perform a scene reconstruction of an environment in which the user of the system is located. Based on the reconstructed scene, the VR/AR/MR can generate display effects to provide an interactive experience. To reconstruct a scene, a subset of pixel cells within a pixel cell array can perform 3D sensing to, for example, identify a set of physical objects in the environment and determine the distances between the physical objects and the user. Another subset of pixel cells within the pixel cell array can perform 2D sensing to, for example, capture visual attributes including textures, colors, and reflectivity of these physical objects. The 2D and 3D image data of the scene can then be merged to create, for example, a 3D model of the scene including the visual attributes of the objects. As another example, a wearable VR/AR/MR system can also perform a head tracking operation based on a fusion of 2D and 3D image data. For example, based on the 2D image data, the VR/AR/AR system can extract certain image features to identify an object. Based on the 3D image data, the VR/AR/AR system can track a location of the identified object relative to the wearable device worn by the user. The VR/AR/AR system can track the head movement based on, for example, tracking the change in the location of the identified object relative to the wearable device as the user's head moves.

Using different sets of pixel for 2D and 3D imaging, however, can pose a number of challenges. First, because only a subset of the pixel cells of the array is used to perform either 2D imaging or 3D imaging, the spatial resolutions of both of the 2D image and 3D image are lower than the maximum spatial resolution available at the pixel cell array. Although the resolutions can be improved by including more pixel cells, such an approach can lead to increases in the form-factor of the image sensor as well as power consumption, both of which are undesirable especially for a wearable device.

Moreover, since pixel cells assigned to measure light of different wavelength ranges (for 2D and 3D imaging) are not collocated, different pixel cells may capture information of different spots of a scene, which can complicate the mapping between 2D and 3D images. For example, a pixel cell that receives a certain color component of visible light (for 2D imaging) and a pixel cell that receives invisible light (for 3D imaging) may also capture information of different spots of the scene. The output of these pixel cells cannot be simply merged to generate the 2D and 3D images. The lack of correspondence between the output of the pixel cells due to their different locations can be worsened when the pixel cell array is capturing 2D and 3D images of a moving object. While there are processing techniques available to correlate different pixel cell outputs to generate pixels for a 2D image, and to correlate between 2D and 3D images (e.g., interpolation), these techniques are typically computation-intensive and can also increase power consumption.

The present disclosure relates to an apparatus comprising an image sensor to provide collocated 2D and 3D imaging, where the 3D imaging can be performed by indirect time-of-flight operation. The image sensor may include a first photodiode to generate a first charge in response to infra-red light and a second photodiode to generate a second charge in response to visible light, a first charge sensing unit, and a second charge sensing unit. The first photodiode and the second photodiode can be in a semiconductor substrate and forms a stack along a direction of propagation of light in the semiconductor substrate. The first photodiode can be further away from a light receiving surface than the second photodiode, which allows the second photodiode to absorb and convert the visible light component of the incident light while the first photodiode can convert an infra-red light component of the incident light. The semiconductor substrate further includes a barrier layer between the first photodiode and the second photodiode to prevent the first charge from flowing into the second photodiode. The semiconductor substrate further includes a first drain region configured as the first charge sensing unit and a second drain region configured as the second charge sensing unit.

The image sensor further includes a first polysilicon gate and a second polysilicon gate on the semiconductor substrate. The first polysilicon gate can be over a first channel region connected between the first drain region and the first photodiode, whereas the second polysilicon gate can be over a second channel region connected between the second drain region and the first photodiode. The first polysilicon gate can transmit a first control signal to establish a first channel in the first channel region to transfer a first portion of the first charge via the first channel region to the first charge sensing unit to obtain a first measurement result. The second polysilicon gate can transmit a second control signal to establish a second channel in the second channel region to transfer the second portion of the first charge via the second channel region to the second charge sensing unit to obtain a second measurement result. The second polysilicon gate can also transmit a third control signal to transfer the second charge to the second charge sensing unit via the first photodiode (and the second channel region) to obtain a third measurement result. The first control signal and the second control signal can be provided by a controller, which can control a timing of transmission of the first control signal and the second control signal to support an indirect time-of-flight measurement operation, and perform the indirect time-of-flight measurement operation based on the first and second measurement results. The controller can also perform a 2D sensing operation based on the third measurement result.

Specifically, to support the indirect time-of-flight measurement, the apparatus may include an infra-red illuminator. The controller can control the infra-red illuminator to transmit a sequence of infra-red light signals including a first infra-red light signal. The sequence of infra-red light signals can include light pulses, sinusoidal light signals, etc. The controller can control the infra-red illuminator to transmit the first infra-red light signal between a first time and a second time, and enable the first photodiode to generate the first charge based on detecting infra-red light including a second infra-red light signal resulted from reflection of the first infra-red light signal. The controller can then transmit the first control signal and the second control signal at different times to transfer the first portion of the first charge to the first drain region and to transfer the second portion of the first charge to the second drain region, thereby modulating the first charge into the first portion and the second portion.

To measure the phase difference between first infra-red light signal and the second infra-red light signal, the controller can synchronize a timing of transmission the first control signal and the second control signal based on the second time (the end time of the first infra-red light signal), such that the first portion of the first charge can be used to measure a first width of the second infra-red light signal before the second time (the end of transmission of the first infra-red light signal), and the second portion of the first charge can be used to measure a second width of the second infra-red light signal after the second time. The first width and the second width measurements can provide an indication of a relative timing of the second infra-red light signal with respect to the second time, which can represent the timing of the first infra-red light signal. Based on the first width and the second width, as well as the width of the first infra-red light signal, the controller can determine a phase difference between the first infra-red light signal and the second infra-red light signal. The controller can control the illuminator to transmit the sequence of infra-red light signals periodically and modulate the first charge obtained in each light signal period using the first control signal and the second control signal, and determine an average phase difference based on the first portion of the first charge and the second portion of the first charge obtained in a number of light signal periods.

In some examples, to further increase the speed of modulation of the first charge, the first polysilicon gate can be extended to overlap with a first portion of the first photodiode, whereas the second polysilicon gate can be extended to overlap with a second portion of the second photodiode. The first polysilicon gate can transmit the first control signal to modulate the electrical potential of the first portion of the first photodiode, to create an electrical potential gradient between the first portion and second portion of the first photodiode. The electrical potential gradient can speed up the flow of the first portion of the first charge to the first drain region. Similarly, the second polysilicon gate can also transmit the second control signal to modulate the electrical potential of the second portion of the first photodiode to create an electrical potential gradient between the first portion and second portion of the first photodiode to speed up the flow of the second portion of the first charge to the second drain region. Such arrangements can increase the speed of modulation of the first charge, which allow a more accurate measurement of the phase difference and the ToF to be made.

In some examples, the semiconductor substrate can further include a third drain region and a third polysilicon gate. The controller can transmit a fourth control signal via the third polysilicon gate to transfer a third portion of the first charge to the third drain region. The controller can control the timing of the fourth control signal such that the third portion of the first charge corresponds to background infrared light and not the reflected second infra-red light signals. The controller can use the measurement result to remove the background infra-red component from the first portion and the second portion of the first charge, to further improve the accuracy of the time-of-flight measurement operation.

In addition, the first photodiode and the second photodiode can generate, respectively, first charge and second charge simultaneously within an integration period. The controller can control the infra-red illuminator to transmit the first infra-red light signal, and transmit the first signal and the second signal to modulate the first charge generated by the first photodiode, within the integration period. Moreover, within the same integration period, the second photodiode can accumulate the second charge in response to the visible light component of the incident light. The controller can control the electrical potential of the barrier layer to prevent the first charge generated by the first photodiode from flowing into the second photodiode within the integration period. After the controller obtains the measurements of the first charge, the controller can reset one or more of the drain regions, and adjust the electrical potential of the barrier layer to allow the second charge to flow from the second photodiode into the first photodiode, and then to the second drain region (or other drain region) for measurement.

With the examples of the present disclosure, collocated 2D and 3D sensing can be performed as both the first photodiode and the second photodiode receive light from the same spot in a scene and via the same light receiving surface, which can simplify the mapping/correlation process between 2D and 3D images. Moreover, the examples of the present disclosure also allow 3D sensing to be performed based on an indirect ToF measurement operation, which can have more relaxed hardware requirements and lower sensitivity to background signals than a direct ToF measurement operation, and the 3D sensing operation can be more robust as a result. All these can substantially enhance the performance of the image sensor and the applications that rely on the image sensor outputs.

Examples of the present disclosure may include, or be implemented in conjunction with, an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

FIG. 1A is a diagram of an example of a near-eye display 100. Near-eye display 100 presents media to a user. Examples of media presented by near-eye display 100 include one or more images, video, and/or audio. In some embodiments, audio is presented via an external device (e.g., speakers and/or headphones) that receives audio information from the near-eye display 100, a console, or both, and presents audio data based on the audio information. Near-eye display 100 is generally configured to operate as a virtual reality (VR) display. In some embodiments, near-eye display 100 is modified to operate as an augmented reality (AR) display and/or a mixed reality (MR) display.

Near-eye display 100 includes a frame 105 and a display 110. Frame 105 is coupled to one or more optical elements. Display 110 is configured for the user to see content presented by near-eye display 100. In some embodiments, display 110 comprises a waveguide display assembly for directing light from one or more images to an eye of the user.

Near-eye display 100 further includes image sensors 120a, 120b, 120c, and 120d. Each of image sensors 120a, 120b, 120c, and 120d may include a pixel cell array comprising an array of pixel cells and configured to generate image data representing different fields of views along different directions. For example, sensors 120a and 120b may be configured to provide image data representing two field of views towards a direction A along the Z axis, whereas sensor 120c may be configured to provide image data representing a field of view towards a direction B along the X axis, and sensor 120d may be configured to provide image data representing a field of view towards a direction C along the X axis.

In some embodiments, sensors 120a-120d can be configured as input devices to control or influence the display content of the near-eye display 100, to provide an interactive VR/AR/MR experience to a user who wears near-eye display 100. For example, sensors 120a-120d can generate physical image data of a physical environment in which the user is located. The physical image data can be provided to a location tracking system to track a location and/or a path of movement of the user in the physical environment. A system can then update the image data provided to display 110 based on, for example, the location and orientation of the user, to provide the interactive experience. In some embodiments, the location tracking system may operate a SLAM algorithm to track a set of objects in the physical environment and within a view of field of the user as the user moves within the physical environment. The location tracking system can construct and update a map of the physical environment based on the set of objects, and track the location of the user within the map. By providing image data corresponding to multiple fields of views, sensors 120a-120d can provide the location tracking system a more holistic view of the physical environment, which can lead to more objects to be included in the construction and updating of the map. With such arrangement, the accuracy and robustness of tracking a location of the user within the physical environment can be improved.

In some embodiments, near-eye display 100 may further include one or more active illuminator 130 to project light into the physical environment. The light projected can be associated with different frequency spectrums (e.g., visible light, infra-red light, ultra-violet light, etc.), and can serve various purposes. For example, illuminator 130 may project light and/or light patterns in a dark environment (or in an environment with low intensity of infra-red light, ultra-violet light, etc.) to assist sensors 120a-120d in capturing 3D images of different objects within the dark environments. The 3D images may include, for example, pixel data representing the distances between the objects and near-eye display 100. The distance information can be used to, for example, construct a 3D model of the scene, to track a head movement of the user, to track a location of the user, etc. As to be discussed in more detail below, sensors 120a-120d can be operated in a first mode for 2D sensing and in a second mode for 3D sensing at different times. The 2D and 3D image data can be merged and provided to a system to provide a more robust tracking of, for example, the location of the user, the head movement of the user, etc.

Figure 1B:
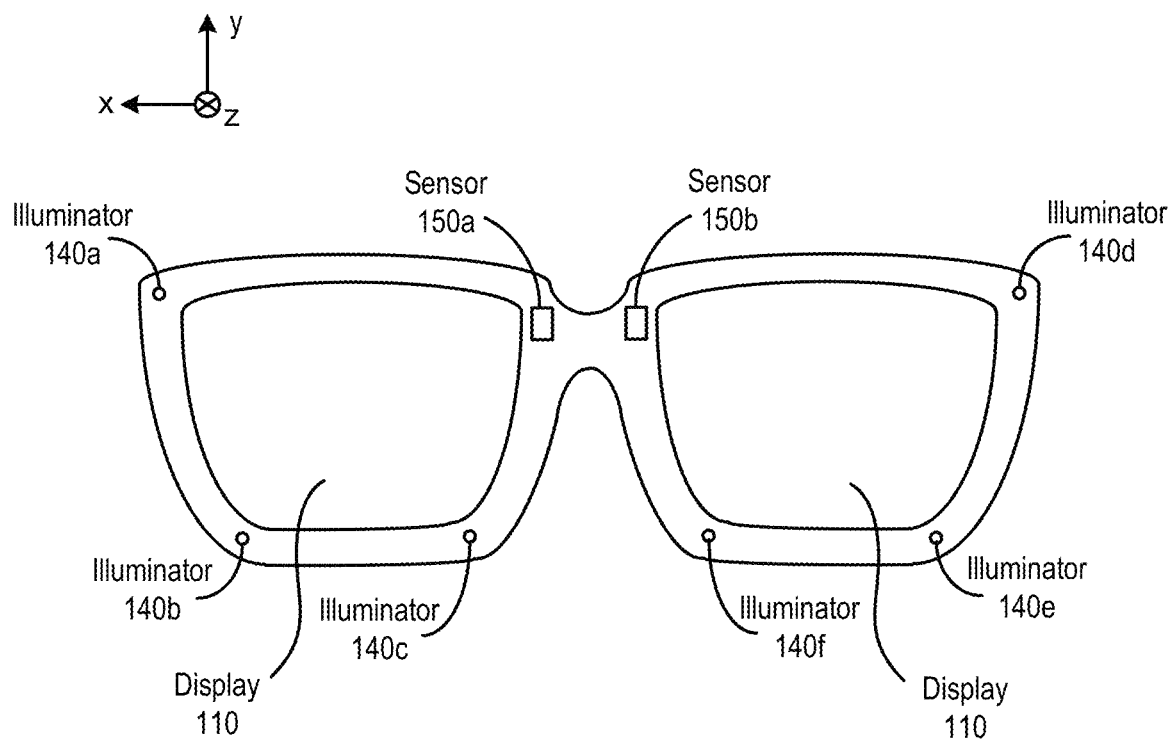
Figure 1B:
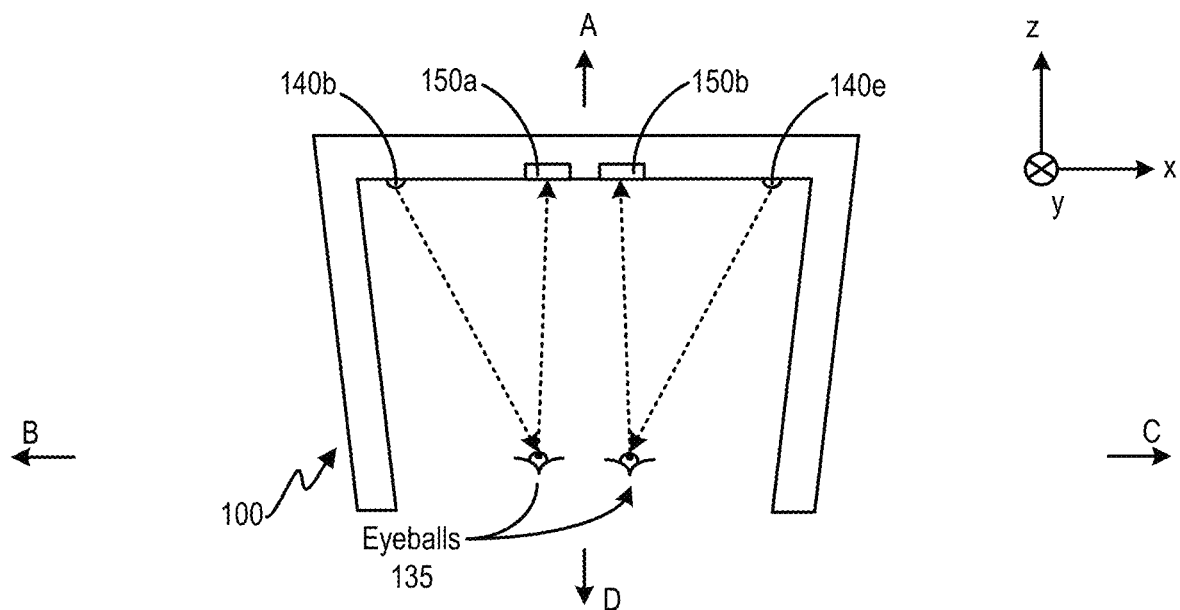

FIG. 1B is a diagram of another embodiment of near-eye display 100. FIG. 1B illustrates a side of near-eye display 100 that faces the eyeball(s) 135 of the user who wears near-eye display 100. As shown in FIG. 1B, near-eye display 100 may further include a plurality of illuminators 140a, 140b, 140c, 140d, 140e, and 140f. Near-eye display 100 further includes a plurality of image sensors 150a and 150b. Illuminators 140a, 140b, and 140c may emit lights of certain optical frequency range (e.g., NIR) towards direction D (which is opposite to direction A of FIG. 1A). The emitted light may be associated with a certain pattern, and can be reflected by the left eyeball of the user. Sensor 150a may include a pixel cell array to receive the reflected light and generate an image of the reflected pattern. Similarly, illuminators 140d, 140e, and 140f may emit NIR lights carrying the pattern. The NIR lights can be reflected by the right eyeball of the user, and may be received by sensor 150b. Sensor 150b may also include a pixel cell array to generate an image of the reflected pattern. Based on the images of the reflected pattern from sensors 150a and 150b, the system can determine a gaze point of the user, and update the image data provided to display 100 based on the determined gaze point to provide an interactive experience to the user. In some examples, image sensors 150a and 150b may include same pixel cells as sensors 120a-120d.

Figure 2:
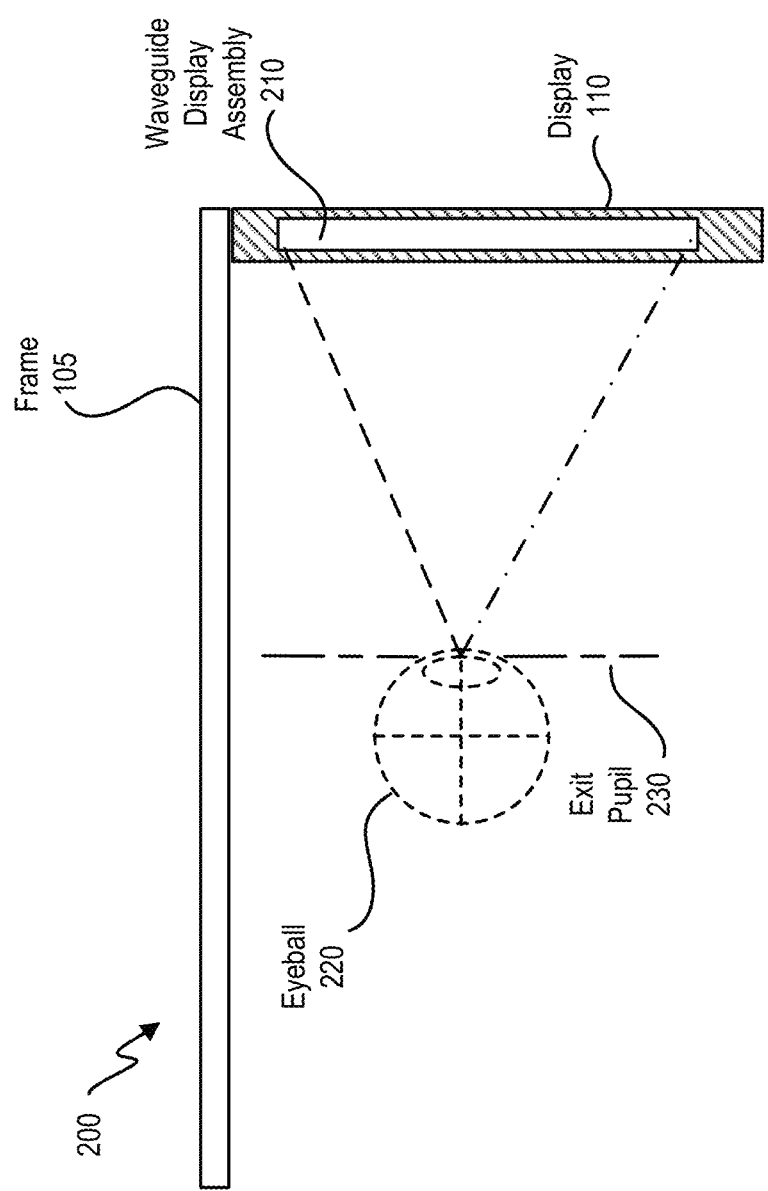
FIG. 2 is an embodiment of a cross section of the near-eye display.

FIG. 2 is an embodiment of a cross section 200 of near-eye display 100 illustrated in FIG. 1. Display 110 includes at least one waveguide display assembly 210. An exit pupil 230 is a location where a single eyeball 220 of the user is positioned in an eyebox region when the user wears the near-eye display 100. For purposes of illustration, FIG. 2 shows the cross section 200 associated eyeball 220 and a single waveguide display assembly 210, but a second waveguide display is used for a second eye of a user.

Waveguide display assembly 210 is configured to direct image light to an eyebox located at exit pupil 230 and to eyeball 220. Waveguide display assembly 210 may be composed of one or more materials (e.g., plastic, glass, etc.) with one or more refractive indices. In some embodiments, near-eye display 100 includes one or more optical elements between waveguide display assembly 210 and eyeball 220.

In some embodiments, waveguide display assembly 210 includes a stack of one or more waveguide displays including, but not restricted to, a stacked waveguide display, a varifocal waveguide display, etc. The stacked waveguide display is a polychromatic display (e.g., a red-green-blue (RGB) display) created by stacking waveguide displays whose respective monochromatic sources are of different colors. The stacked waveguide display is also a polychromatic display that can be projected on multiple planes (e.g., multi-planar colored display). In some configurations, the stacked waveguide display is a monochromatic display that can be projected on multiple planes (e.g., multi-planar monochromatic display). The varifocal waveguide display is a display that can adjust a focal position of image light emitted from the waveguide display. In alternate embodiments, waveguide display assembly 210 may include the stacked waveguide display and the varifocal waveguide display.

Figure 3:
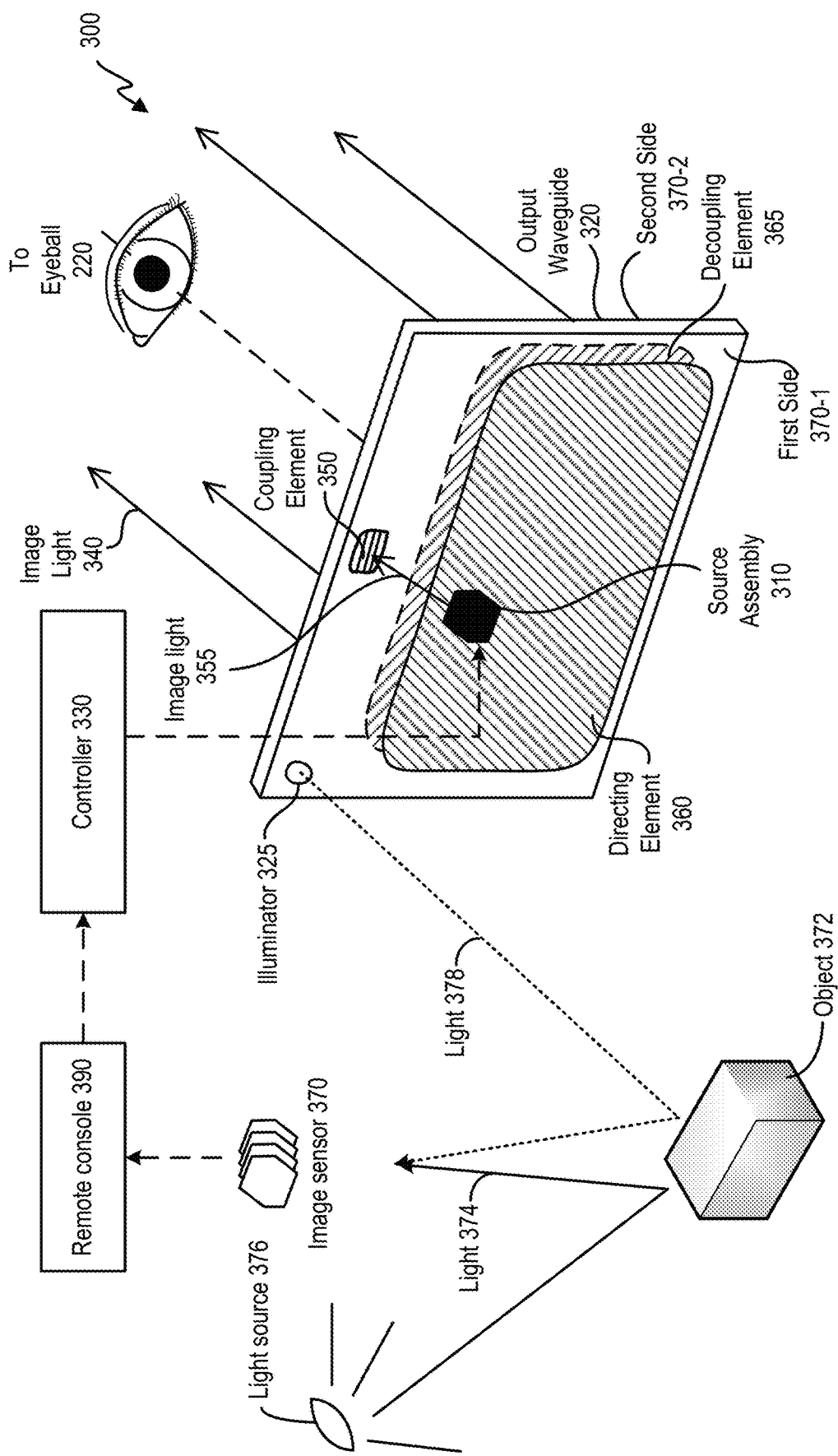
FIG. 3 illustrates an isometric view of an embodiment of a waveguide display.

FIG. 3 illustrates an isometric view of an embodiment of a waveguide display 300. In some embodiments, waveguide display 300 is a component (e.g., waveguide display assembly 210) of near-eye display 100. In some embodiments, waveguide display 300 is part of some other near-eye display or other system that directs image light to a particular location.

Waveguide display 300 includes a source assembly 310, an output waveguide 320, an illuminator 325, and a controller 330. Illuminator 325 can include illuminator 130 of FIG. 1A. For purposes of illustration, FIG. 3 shows the waveguide display 300 associated with a single eyeball 220, but in some embodiments, another waveguide display separate, or partially separate, from the waveguide display 300 provides image light to another eye of the user.

Source assembly 310 generates image light 355. Source assembly 310 generates and outputs image light 355 to a coupling element 350 located on a first side 370-1 of output waveguide 320. Output waveguide 320 is an optical waveguide that outputs expanded image light 340 to an eyeball 220 of a user. Output waveguide 320 receives image light 355 at one or more coupling elements 350 located on the first side 370-1 and guides received input image light 355 to a directing element 360. In some embodiments, coupling element 350 couples the image light 355 from source assembly 310 into output waveguide 320. Coupling element 350 may be, e.g., a diffraction grating, a holographic grating, one or more cascaded reflectors, one or more prismatic surface elements, and/or an array of holographic reflectors.

Directing element 360 redirects the received input image light 355 to decoupling element 365 such that the received input image light 355 is decoupled out of output waveguide 320 via decoupling element 365. Directing element 360 is part of, or affixed to, first side 370-1 of output waveguide 320. Decoupling element 365 is part of, or affixed to, second side 370-2 of output waveguide 320, such that directing element 360 is opposed to the decoupling element 365. Directing element 360 and/or decoupling element 365 may be, e.g., a diffraction grating, a holographic grating, one or more cascaded reflectors, one or more prismatic surface elements, and/or an array of holographic reflectors.

Second side 370-2 represents a plane along an x-dimension and a y-dimension. Output waveguide 320 may be composed of one or more materials that facilitate total internal reflection of image light 355. Output waveguide 320 may be composed of e.g., silicon, plastic, glass, and/or polymers. Output waveguide 320 has a relatively small form factor. For example, output waveguide 320 may be approximately 50 mm wide along x-dimension, 30 mm long along y-dimension and 0.5-1 mm thick along a z-dimension.

Controller 330 controls scanning operations of source assembly 310. The controller 330 determines scanning instructions for the source assembly 310. In some embodiments, the output waveguide 320 outputs expanded image light 340 to the user's eyeball 220 with a large field of view (FOV). For example, the expanded image light 340 is provided to the user's eyeball 220 with a diagonal FOV (in x and y) of 60 degrees and/or greater and/or 150 degrees and/or less. The output waveguide 320 is configured to provide an eyebox with a length of 20 mm or greater and/or equal to or less than 50 mm; and/or a width of 10 mm or greater and/or equal to or less than 50 mm.

Moreover, controller 330 also controls image light 355 generated by source assembly 310, based on image data provided by image sensor 370. Image sensor 370 may be located on first side 370-1 and may include, for example, image sensors 120a-120d of FIG. 1A. Image sensors 120a-120d can be operated to perform 2D sensing and 3D sensing of, for example, an object 372 in front of the user (e.g., facing first side 370-1). For 2D sensing, each pixel cell of image sensors 120a-120d can be operated to generate pixel data representing an intensity of light 374 generated by a light source 376 and reflected off object 372. For 3D sensing, each pixel cell of image sensors 120a-120d can be operated to generate pixel data representing a time-of-flight measurement for light 378 generated by illuminator 325. For example, each pixel cell of image sensors 120a-120d can determine a first time when illuminator 325 is enabled to project light 378 and a second time when the pixel cell detects light 378 reflected off object 372. The difference between the first time and the second time can indicate the time-of-flight of light 378 between image sensors 120a-120d and object 372, and the time-of-flight information can be used to determine a distance between image sensors 120a-120d and object 372. Image sensors 120a-120d can be operated to perform 2D and 3D sensing at different times, and provide the 2D and 3D image data to a remote console 390 that may be (or may be not) located within waveguide display 300. The remote console may combine the 2D and 3D images to, for example, generate a 3D model of the environment in which the user is located, to track a location and/or orientation of the user, etc. The remote console may determine the content of the images to be displayed to the user based on the information derived from the 2D and 3D images. The remote console can transmit instructions to controller 330 related to the determined content. Based on the instructions, controller 330 can control the generation and outputting of image light 355 by source assembly 310, to provide an interactive experience to the user.

Figure 4:
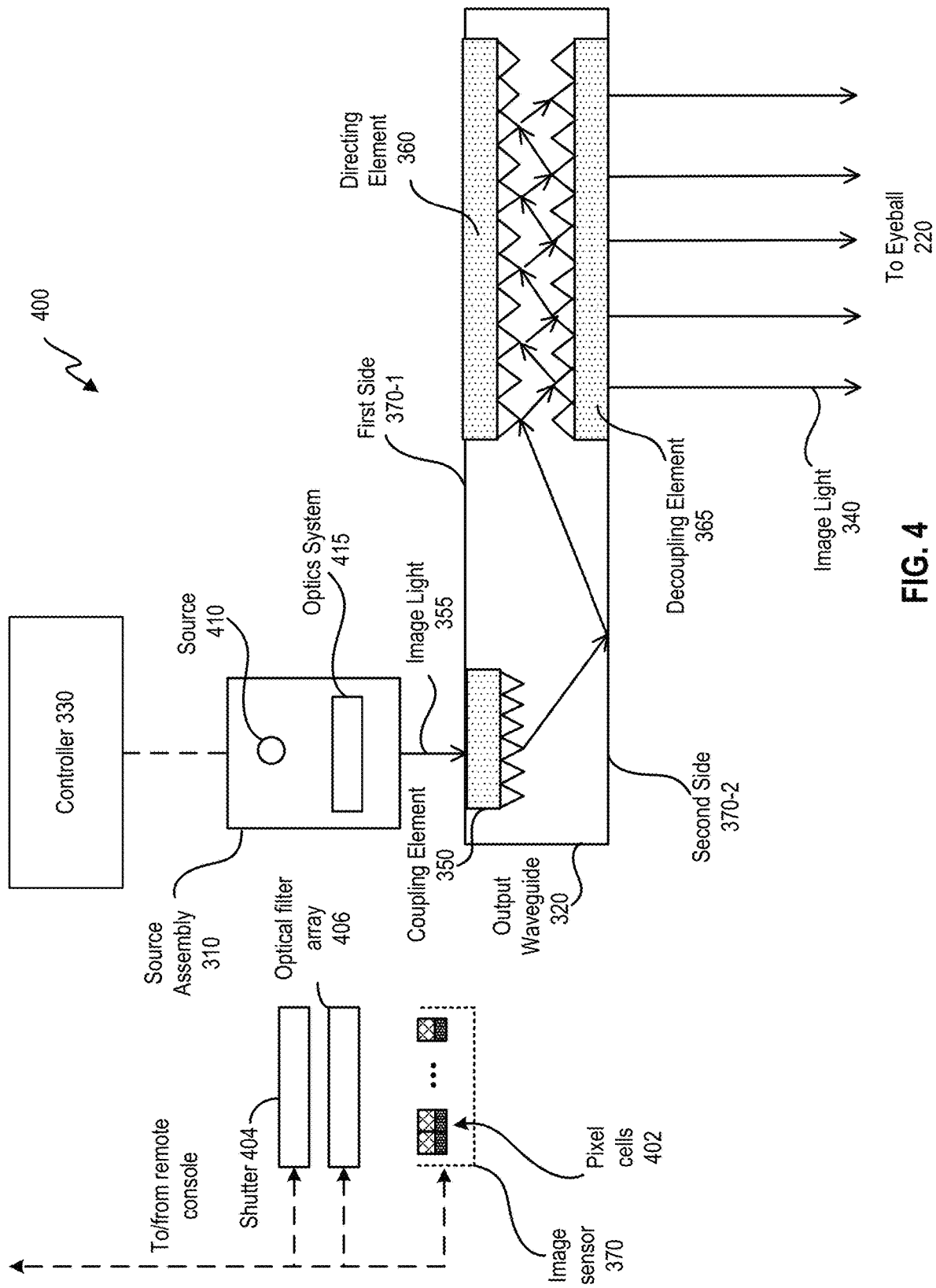
FIG. 4 illustrates a cross section of an embodiment of the waveguide display.

FIG. 4 illustrates an embodiment of a cross section 400 of the waveguide display 300. The cross section 400 includes source assembly 310, output waveguide 320, and image sensor 370. In the example of FIG. 4, image sensor 370 may include a set of pixel cells 402 located on first side 370-1 to generate an image of the physical environment in front of the user. In some embodiments, there can be a mechanical shutter 404 and an optical filter array 406 interposed between the set of pixel cells 402 and the physical environment. Mechanical shutter 404 can control the exposure of the set of pixel cells 402. In some embodiments, the mechanical shutter 404 can be replaced by an electronic shutter gate, as to be discussed below. Optical filter array 406 can control an optical wavelength range of light the set of pixel cells 402 is exposed to, as to be discussed below. Each of pixel cells 402 may correspond to one pixel of the image. Although not shown in FIG. 4, it is understood that each of pixel cells 402 may also be overlaid with a filter to control the optical wavelength range of the light to be sensed by the pixel cells.

After receiving instructions from the remote console, mechanical shutter 404 can open and expose the set of pixel cells 402 in an exposure period. During the exposure period, image sensor 370 can obtain samples of lights incident on the set of pixel cells 402, and generate image data based on an intensity distribution of the incident light samples detected by the set of pixel cells 402. Image sensor 370 can then provide the image data to the remote console, which determines the display content, and provide the display content information to controller 330. Controller 330 can then determine image light 355 based on the display content information.

Source assembly 310 generates image light 355 in accordance with instructions from the controller 330. Source assembly 310 includes a source 410 and an optics system 415. Source 410 is a light source that generates coherent or partially coherent light. Source 410 may be, e.g., a laser diode, a vertical cavity surface emitting laser, and/or a light emitting diode.

Optics system 415 includes one or more optical components that condition the light from source 410. Conditioning light from source 410 may include, e.g., expanding, collimating, and/or adjusting orientation in accordance with instructions from controller 330. The one or more optical components may include one or more lenses, liquid lenses, mirrors, apertures, and/or gratings. In some embodiments, optics system 415 includes a liquid lens with a plurality of electrodes that allows scanning of a beam of light with a threshold value of scanning angle to shift the beam of light to a region outside the liquid lens. Light emitted from the optics system 415 (and also source assembly 310) is referred to as image light 355.

Output waveguide 320 receives image light 355. Coupling element 350 couples image light 355 from source assembly 310 into output waveguide 320. In embodiments where coupling element 350 is diffraction grating, a pitch of the diffraction grating is chosen such that total internal reflection occurs in output waveguide 320, and image light 355 propagates internally in output waveguide 320 (e.g., by total internal reflection), toward decoupling element 365.

Directing element 360 redirects image light 355 toward decoupling element 365 for decoupling from output waveguide 320. In embodiments where directing element 360 is a diffraction grating, the pitch of the diffraction grating is chosen to cause incident image light 355 to exit output waveguide 320 at angle(s) of inclination relative to a surface of decoupling element 365.

In some embodiments, directing element 360 and/or decoupling element 365 are structurally similar. Expanded image light 340 exiting output waveguide 320 is expanded along one or more dimensions (e.g., may be elongated along x-dimension). In some embodiments, waveguide display 300 includes a plurality of source assemblies 310 and a plurality of output waveguides 320. Each of source assemblies 310 emits a monochromatic image light of a specific band of wavelength corresponding to a primary color (e.g., red, green, or blue). Each of output waveguides 320 may be stacked together with a distance of separation to output an expanded image light 340 that is multi-colored.

Figure 5:
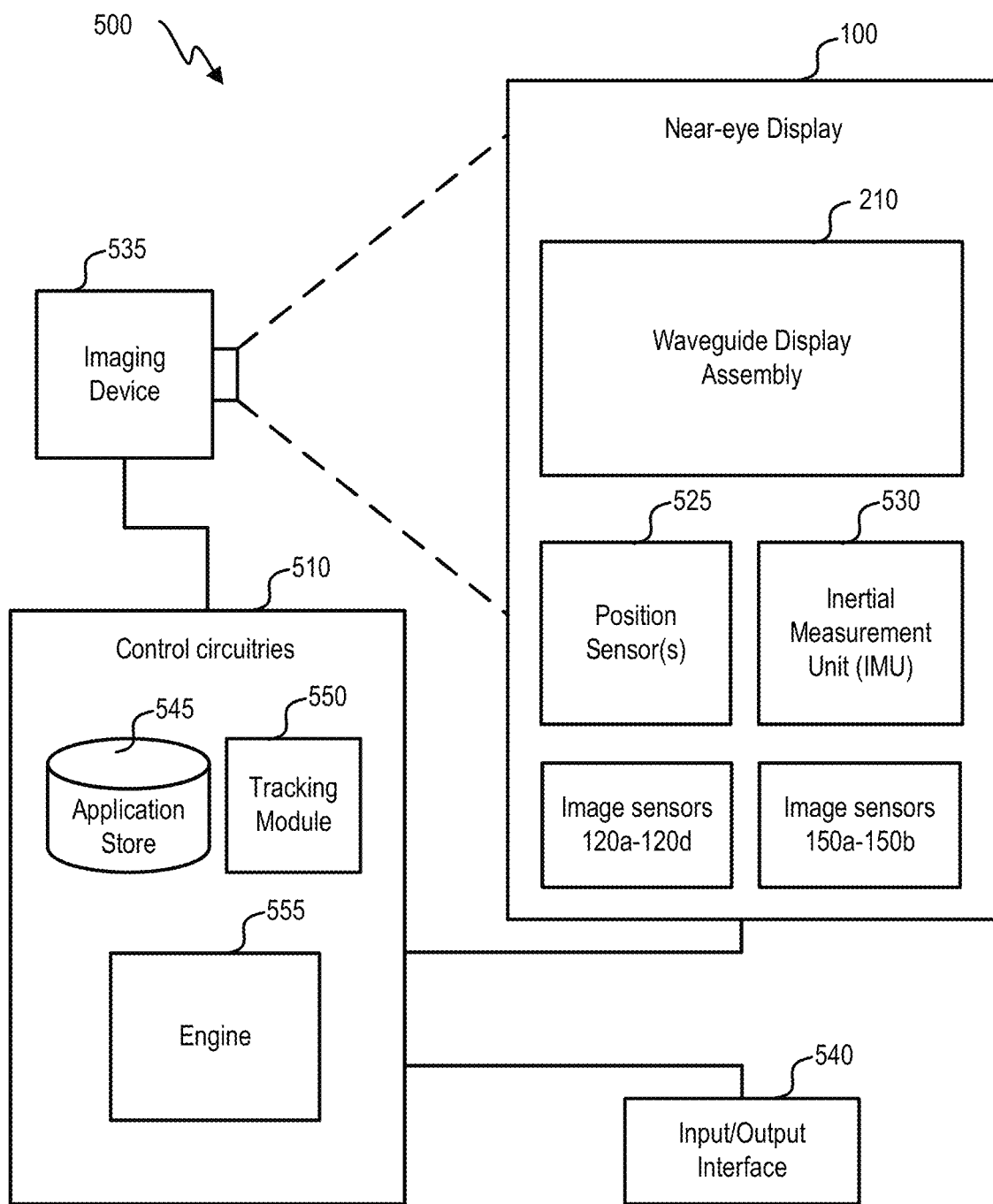
FIG. 5 is a block diagram of an embodiment of a system including the near-eye display.

FIG. 5 is a block diagram of an embodiment of a system 500 including the near-eye display 100. The system 500 comprises near-eye display 100, an imaging device 535, an input/output interface 540, and image sensors 120a-120d and 150a-150b that are each coupled to control circuitries 510. System 500 can be configured as a head-mounted device, a wearable device, etc.

Near-eye display 100 is a display that presents media to a user. Examples of media presented by the near-eye display 100 include one or more images, video, and/or audio. In some embodiments, audio is presented via an external device (e.g., speakers and/or headphones) that receives audio information from near-eye display 100 and/or control circuitries 510 and presents audio data based on the audio information to a user. In some embodiments, near-eye display 100 may also act as an AR eyewear glass. In some embodiments, near-eye display 100 augments views of a physical, real-world environment, with computer-generated elements (e.g., images, video, sound, etc.).

Near-eye display 100 includes waveguide display assembly 210, one or more position sensors 525, and/or an inertial measurement unit (IMU) 530. Waveguide display assembly 210 includes source assembly 310, output waveguide 320, and controller 330.

IMU 530 is an electronic device that generates fast calibration data indicating an estimated position of near-eye display 100 relative to an initial position of near-eye display 100 based on measurement signals received from one or more of position sensors 525.

Imaging device 535 may generate image data for various applications. For example, imaging device 535 may generate image data to provide slow calibration data in accordance with calibration parameters received from control circuitries 510. Imaging device 535 may include, for example, image sensors 120a-120d of FIG. 1A for generating 2D image data and 3D image data of a physical environment in which the user is located to track the location and head movement of the user. Imaging device 535 may further include, for example, image sensors 150a-150b of FIG. 1B for generating image data (e.g., 2D image data) for determining a gaze point of the user, to identify an object of interest of the user.

The input/output interface 540 is a device that allows a user to send action requests to the control circuitries 510. An action request is a request to perform a particular action. For example, an action request may be to start or end an application or to perform a particular action within the application.

Control circuitries 510 provides media to near-eye display 100 for presentation to the user in accordance with information received from one or more of: imaging device 535, near-eye display 100, and input/output interface 540. In some examples, control circuitries 510 can be housed within system 500 configured as a head-mounted device. In some examples, control circuitries 510 can be a standalone console device communicatively coupled with other components of system 500. In the example shown in FIG. 5, control circuitries 510 include an application store 545, a tracking module 550, and an engine 555.

The application store 545 stores one or more applications for execution by the control circuitries 510. An application is a group of instructions, that, when executed by a processor, generates content for presentation to the user. Examples of applications include: gaming applications, conferencing applications, video playback application, or other suitable applications.

Tracking module 550 calibrates system 500 using one or more calibration parameters and may adjust one or more calibration parameters to reduce error in determination of the position of the near-eye display 100.

Tracking module 550 tracks movements of near-eye display 100 using slow calibration information from the imaging device 535. Tracking module 550 also determines positions of a reference point of near-eye display 100 using position information from the fast calibration information.

Engine 555 executes applications within system 500 and receives position information, acceleration information, velocity information, and/or predicted future positions of near-eye display 100 from tracking module 550. In some embodiments, information received by engine 555 may be used for producing a signal (e.g., display instructions) to waveguide display assembly 210 that determines a type of content presented to the user. For example, to provide an interactive experience, engine 555 may determine the content to be presented to the user based on a location of the user (e.g., provided by tracking module 550), a gaze point of the user (e.g., based on image data provided by imaging device 535), a distance between an object and user (e.g., based on image data provided by imaging device 535).

Figure 6:
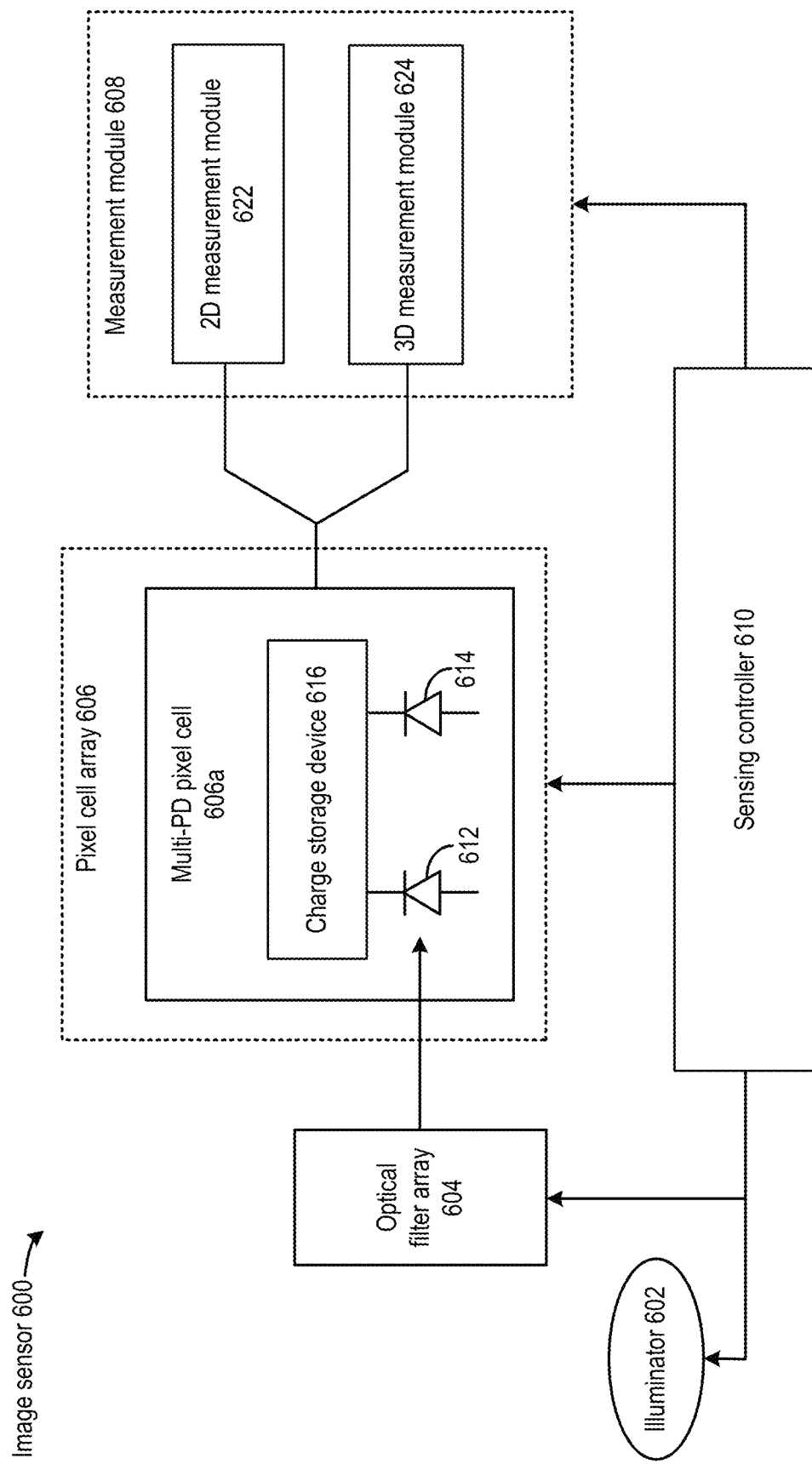
FIG. 6 illustrates an example of an image sensor including a multi-photodiode pixel cell.

FIG. 6 illustrates an example of an image sensor 600. Image sensor 600 can use the same pixel cell for both 2D sensing and 3D sensing. For example, the same pixel cell can be configured to detect a color component (e.g., red, green, or blue color) of visible light for 2D sensing, and to detect infra-red light for 3D sensing. Image sensor 600 can be part of near-eye display 100, and can provide 2D and 3D image data to control circuitries 510 of FIG. 5 to control the display content of near-eye display 100. In the example of FIG. 6, image sensor 600 may include an illuminator 602, an optical filter array 604, a pixel cell array 606, including a pixel cell 606a, and a digitizer module 608.

Illuminator 602 may be an infra-red illuminator, such as a laser, a light emitting diode (LED), etc., that can project infra-red light for 3D sensing. The projected light may include, for example, structured light, light pulses, etc. Optical filter array 604 may include an array of filter elements, with each filter element corresponding to a pixel cell of pixel cell array 606 (e.g., pixel cell 606a). Each filter element can be configured to absorb a certain wavelength range of incident light and transmit the rest of the light to the corresponding pixel cell. The incident light may include ambient visible light as well as infra-red light projected by illuminator 602 and reflected by an object. For example, one filter element may transmit a green component of visible light as well as the infra-red light to a pixel cell, whereas another filter element may transmit a blue component of visible light as well as the infra-red light to another pixel cell. In some examples, optical filter array 604 may be configurable to select the color component of visible light to be transmitted with the infra-red light, so that the pixel cell 606a can be used to detect different color components of visible light as well as infra-red light.

Moreover, pixel cell 606a may include multiple photodiodes to detect the different color components of visible light as well as infra-red light of the incident light. For example, as shown in FIG. 6, pixel cell 606a may include a photodiode 612 and a photodiode 614. Photodiode 612 and photodiode 614 can be pinned photodiodes. Photodiode 612 may detect a first component of the incident light of a first wavelength range (e.g., one of red, blue or green colors of visible light), convert the detected photons to charge, and store the charge, within an exposure period. Moreover, photodiode 614 may detect a second component of the incident light of a second wavelength range (e.g., infra-red light), convert the detected photons to charge, and store the charge, within the same or different exposure periods. Pixel cell 606a may further include a charge sensing unit 616, which can include a floating drain node, a metal capacitor, or a combination of both. At the end of the exposure periods, the charge stored at photodiodes 612 and 614 can be transferred to charge sensing unit 616 to develop voltages for 2D and 3D sensing.

Image sensor 600 further includes a measurement module 608. Measurement module 608 may further include a 2D measurement module 622 to perform 2D imaging operations based on the charge generated by photodiode 612. The 2D imaging operation may include, for example, generating a pixel value based on the magnitude of the voltage developed at charge sensing unit 616 which reflects the total quantity of charge stored at photodiode 612 during the exposure period. Measurement module 608 may include a 3D measurement module 624 to perform 3D imaging operations based on the charge generated by photodiode 614. The 3D imaging operations may include, for example, detecting a pattern of structured light reflected by a surface of an object, and comparing the detected pattern with the pattern of structured light projected by illuminator 602 to determine the depths of different points of the surface with respect to the pixel cells array. For detection of the pattern of reflected light, 3D measurement module 624 can generate a pixel value based on the magnitude of the voltage developed at charge sensing unit 616 which reflects the total quantity of charge stored at photodiode 614 during the exposure period. As another example, 3D measurement module 624 can generate a pixel value representing a time-of-flight measurement of light pulses transmitted by illuminator 602 and reflected by the object.

Figure 7A:
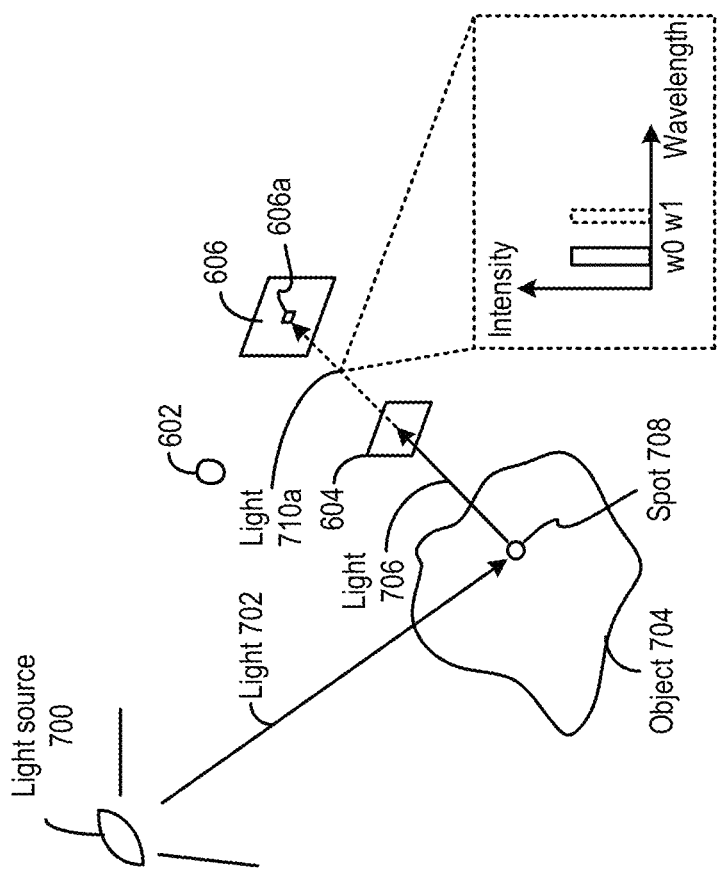
FIG. 7A, FIG. 7B, and FIG. 7C illustrate examples of operations of the image sensor of FIG. 6.
Figure 7B:
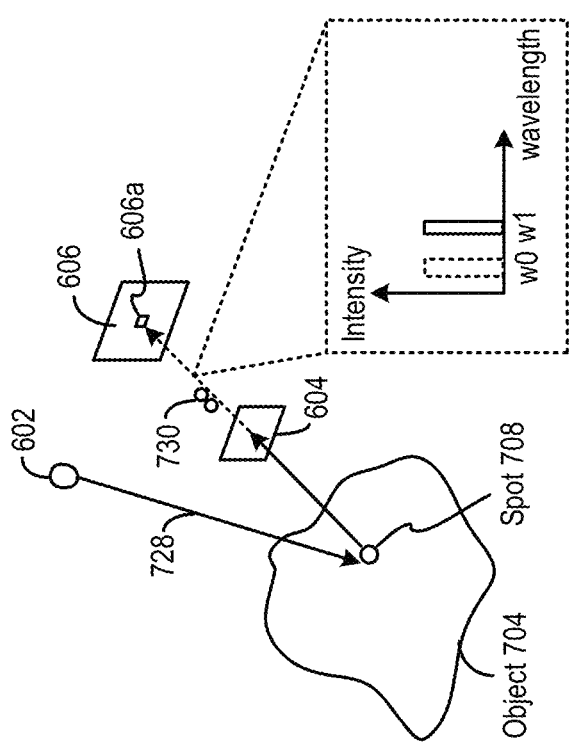
Figure 7C:
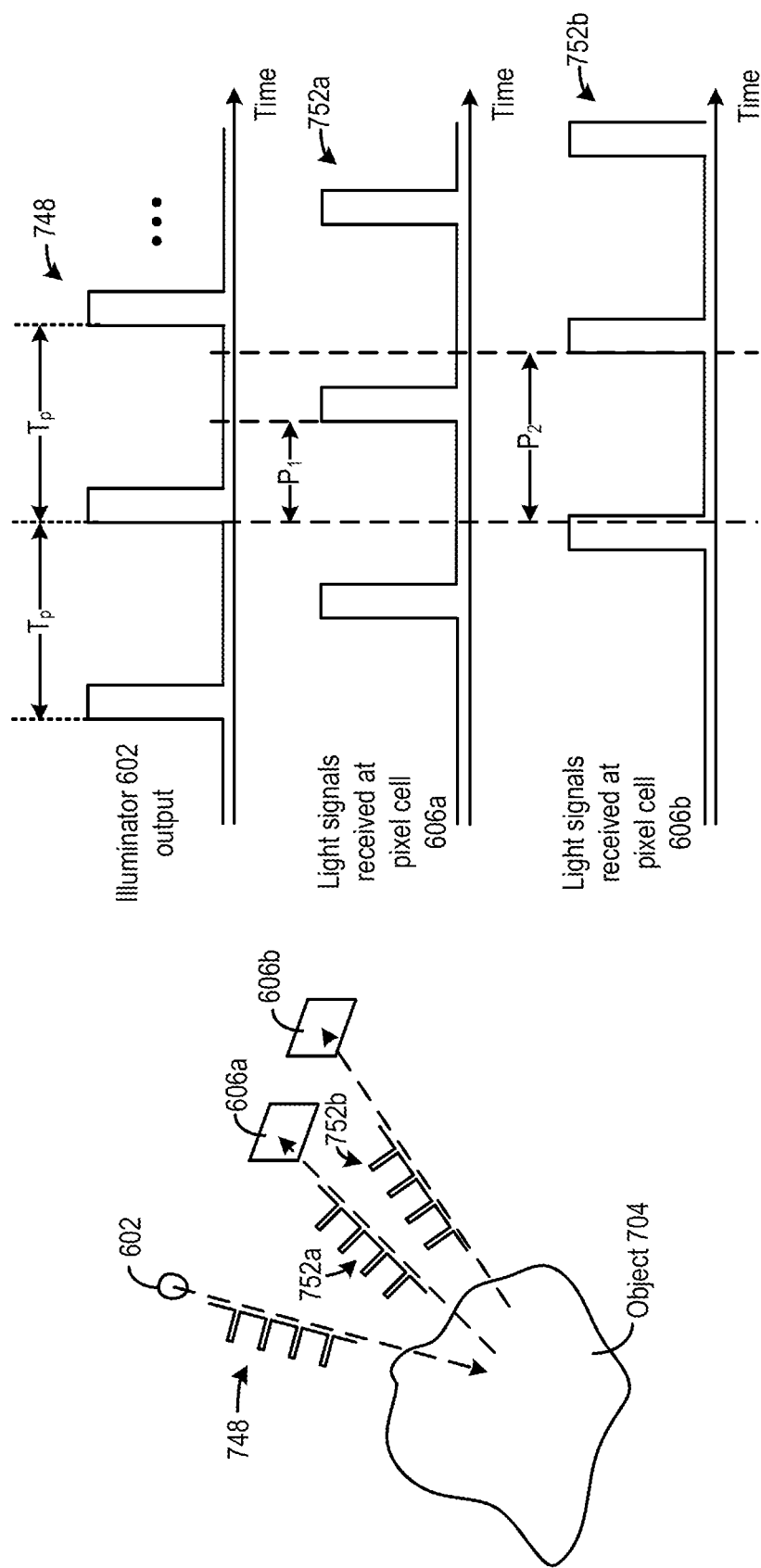

Image sensor 600 further includes a sensing controller 610 to control different components of image sensor 600 to perform 2D and 3D imaging of an object. Reference is now made to FIG. 7A-FIG. 7C, which illustrate examples of operations of image sensor 600 for 2D and 3D imaging. FIG. 7A illustrates an example of operations for 2D imaging. For 2D imaging, pixel cells array 606 can detect visible light in the environment including visible light reflected off an object. For example, referring to FIG. 7A, visible light source 700 (e.g., a light bulb, the sun, or other sources of ambient visible light) can project visible light 702 onto an object 704. Visible light 706 can be reflected off a spot 708 of object 704. Visible light 706 can be filtered by optical filter array 604 to pass a pre-determined wavelength range w0 of the reflected visible light 706, to produce filtered light 710a. Wavelength range w0 may correspond to a first color component of visible light 706 (e.g., a red color component having a wavelength range of 620-750 nanometers (nm)) reflected off spot 708. Filtered light 710a can be captured by first photodiode 612 of pixel cell 606a to generate and accumulate first charge within an exposure period. At the end of the exposure period, sensing controller 610 can steer the first charge to charge sensing unit 616 to generate the voltage representing the intensity of the first color component, and provide the first voltage to 2D measurement module 622. 2D measurement module 622 may include an analog-to-digital converter (ADC) and can be controlled by sensing controller 610 to sample and quantize the first voltage to generate a digital value representing the intensity of the first color component of visible light 706.

Furthermore, image sensor 600 can also perform 3D imaging of object 704. Referring to FIG. 7B, sensing controller 610 can control illuminator 602 to project infra-red light 728, which can include a light pulse, structured light, etc., onto object 704. Infra-red light 728 can have a wavelength range of 700 nanometers (nm) to 1 millimeter (mm). Infra-red photons 730 can reflect off object 704 and propagate towards pixel cells array 606 and pass through optical filter 604. In some examples, second photodiode 614 of pixel cell 606a can convert infra-red photons 730 into a second charge. The detection and conversion of infra-red photons 730 by second photodiode 614 can occur within the same exposure period as the detection and conversion of visible light 706 by first photodiode 612. Such arrangements allow each pixel cell to perform 2D and 3D imaging of the same spot of an object, which can improve the correspondence between the 2D and 3D images. Sensing controller 610 can steer the second charge to charge sensing unit 616 to generate the a voltage representing the intensity of the infra-red light received at the pixel cell.

3D measurement module 624 can perform different types of depth-sensing operations based on the type of light 728 projected onto object 704. One example being an indirect time-of-flight measurement operation. FIG. 7C illustrates an example of an indirect time-of-flight measurement operation that can be performed by image sensor 600. In the example of FIG. 7C, sensing controller 610 can control illuminator 602 to project an infra-red light signal sequence 748, which can be a sequence of pulses (as shown in FIG. 7C) or can be in the form of a continuous waveform (e.g., a sinusoidal waveform). The infra-red light signal sequence 748 can be periodic and have a period $T_p$. Infra-red light signal sequence 748 can be reflected at different spots of object 704 to become reflected infra-red light signal sequences 752a and 752b, which can be detected by, respectively, pixel cells 606a and 606b. 3D measurement module 624 can generate a first pixel value representing a phase difference P1 between infra-red light signal sequence 748 and reflected infra-red light signal sequence 752a. 3D measurement module 624 can also generate a second pixel value representing a phase difference P2 between infra-red light signal sequence 748 and reflected infra-red light signal sequence 752b. The pixel values representing the phase differences can also be used provide an estimation of a distance between the pixel cells and different points on the surface of object 704.

Figure 8:
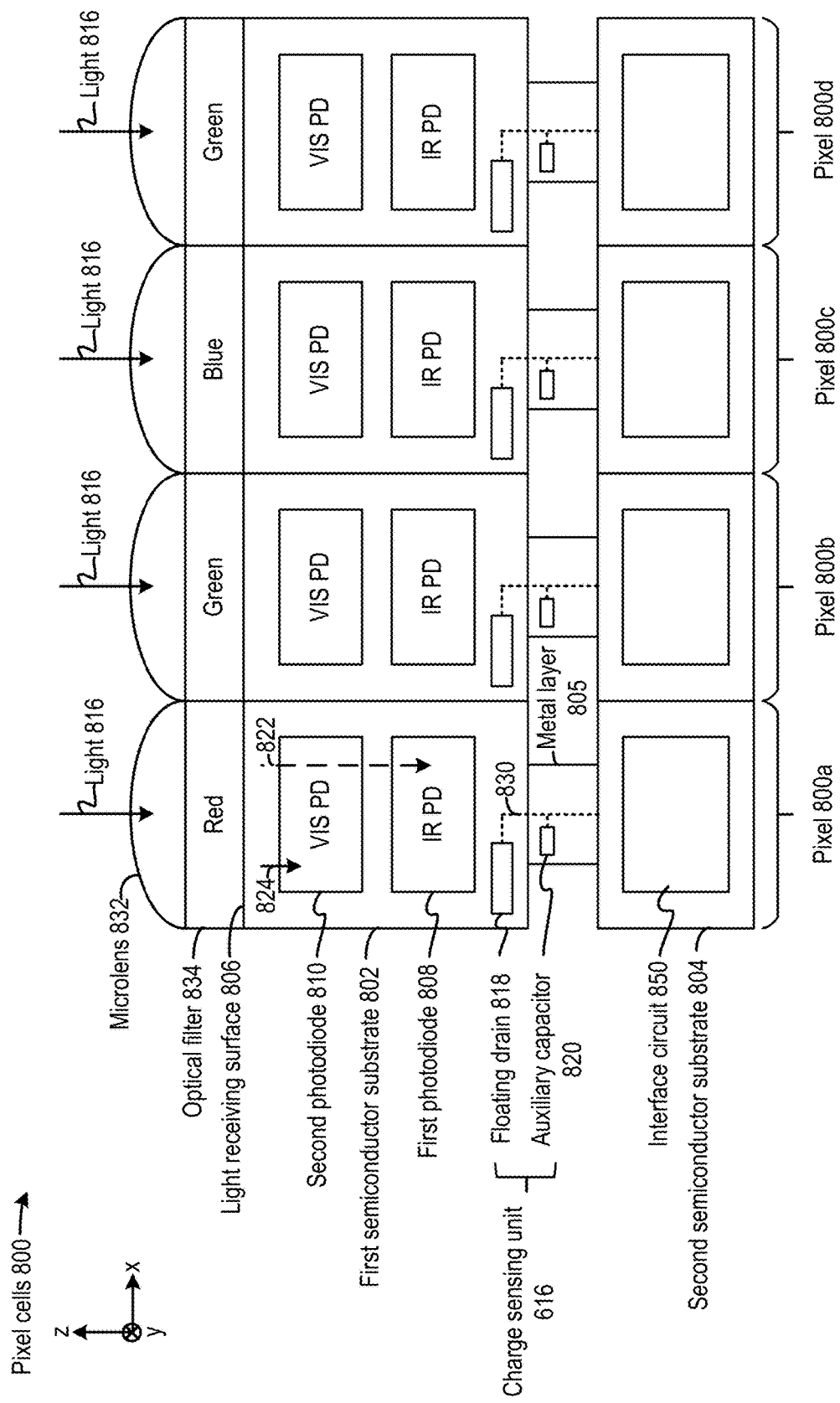
FIG. 8 illustrates an example of an array of pixel cells that can be part of the image sensor of FIG. 6.

FIG. 8 illustrates an example of an array of pixel cells 800 (e.g., pixel cells 800a, 800b, 800c, and 800d) which can perform collocated 2D and 3D image sensing and can be part of image sensor 600. As shown in FIG. 8, each of pixel cells 800 can include a first semiconductor substrate 802, a second semiconductor substrate 804, as well as a metal layer 805 sandwiched between the substrates. First semiconductor substrate 802 can include a light receiving surface 806, a first photodiode 808, a second photodiode 810, and charge sensing unit 616, whereas second semiconductor substrate 804 can include an interface circuit 850. First photodiode 808 and second photodiode 810 can form a stack along an axis perpendicular to light receiving surface 806 (e.g., along the z-axis). Second photodiode 810 can be configured as a visible light sensing photodiode ("VIS PD") whereas first photodiode 808 can be configured as an infra-red light sensing photodiode ("IR PD"). Specifically, second photodiode 810 can be closer to light receiving surface 806 than first photodiode 808. As light 816 enters via light receiving surface 806 and propagates within first semiconductor substrate 802, a first light component 822 of light 816 having the relatively longer infra-light wavelength range can propagate through second photodiode 810 to reach and can be absorbed by first photodiode 808. Moreover, a second light component 824 of light 816 having the relatively shorter visible light wavelength range stops at second photodiode 810 and can be absorbed by second photodiode 810.

Each of pixel cells 800 also includes optical components to control the properties of first light component 822 and second light component 824 of light 816. For example, each of pixel cells 800 includes a microlens 832 to focus light 816, as well as an optical filter 834 to select, for example, the wavelength range of second light component 824 (e.g., one of red, green, or blue colors) to be absorbed/measured by second photodiode 810. As shown in FIG. 8, each of pixel cells 800a, 800b, 800c, and 800d can receive infra-red light as first light component 822, but receive visible light of different wavelength ranges as second light component 824 based on the configuration of color filter 834. In the example of FIG. 8, pixel cell 800a may receive red light as second light component 824, pixel cells 800b and 800d may receive green light as second light component 824, whereas pixel cell 800c may receive blue light as second light component 824.

Each of first photodiode 808 and second photodiode 810 can generate charge responsive to, respectively, first light component 822 and second light component 824. The rate of charge generation by each photodiode can represent the intensities of first light component 822 and second light component 824. The charge generated by first photodiode 808 and second photodiode 810 can be stored in charge sensing unit 616 which, in the example of FIG. 8, can include a floating drain 818 in first semiconductor substrate 802 and an auxiliary metallic capacitor 820 in metal layer 805. The quantity of charge accumulated in charge sensing unit 616, can be measured by interface circuit 850. Interface circuit 850 may include measurement module 608 of FIG. 6 to determine, for example, the intensities of first light component 822 and second light component 824. Metal layer 105 further includes metal interconnects 830 which can couple floating drain 818 and auxiliary metallic capacitor 820 with measurement module 608 of second semiconductor substrate 804. Metal interconnects 830 can transmit voltages developed at charge sensing unit 616 corresponding to the charge generated by first photodiode 808 and second photodiode 810 to measurement module 608 to perform measurements for the 2D and 3D image sensing operations as described above.

Although FIG. 8 illustrates first photodiode 808 and second photodiode 810 of pixel cell 800 forms a stack structure which enables the two photodiodes to sense different light components, pixel cell 800 can adopt other configurations to separate the light components. For example, the two photodiodes can be arranged adjacent to each other along an axis parallel with light receiving surface 806 (e.g., along the x or y axes), and an optical structure can be provided on light receiving surface 806 to split the light components and project/direct different light components to the photodiodes.

Figure 9A:
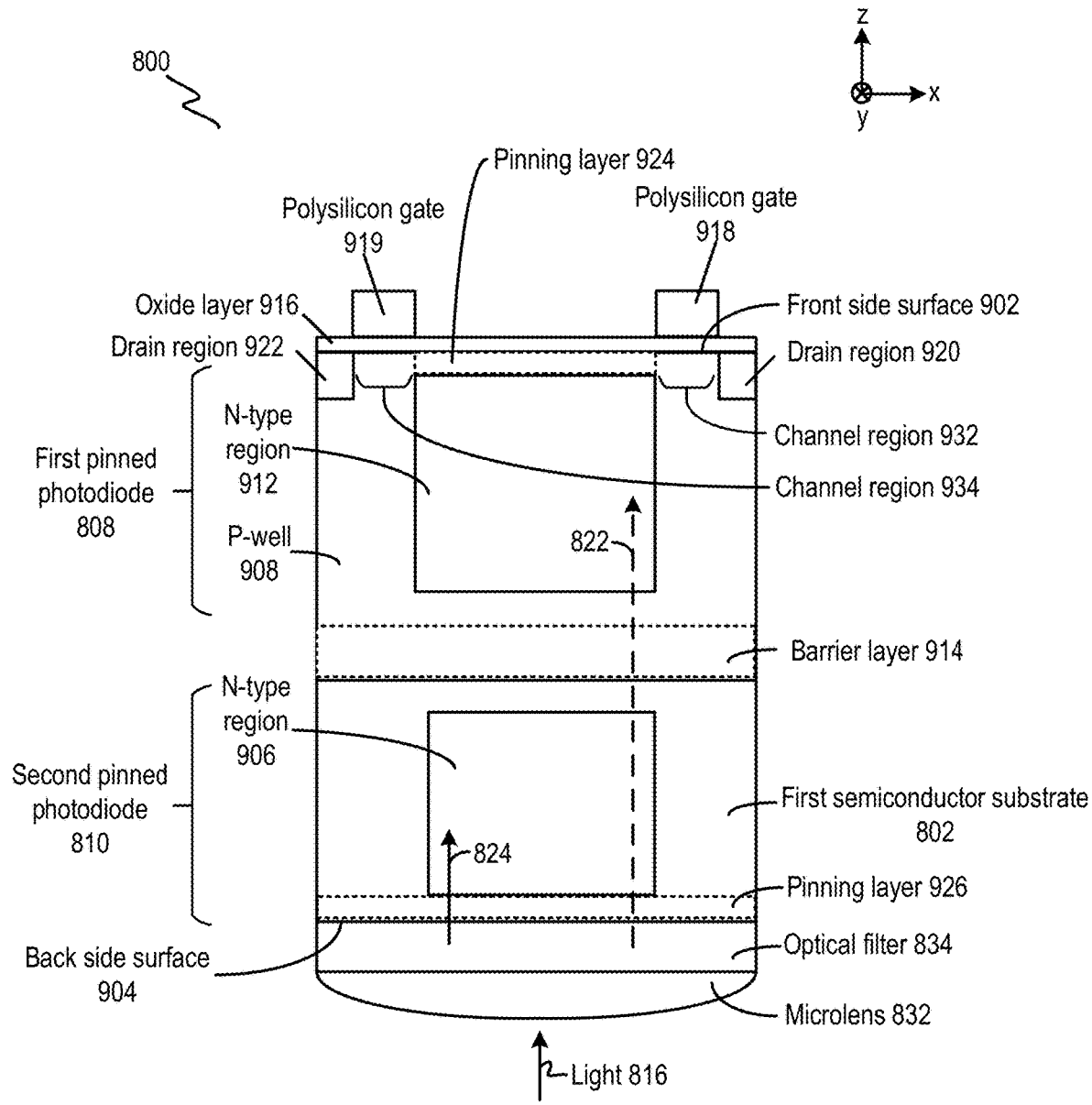
FIG. 9A, FIG. 9B, FIG. 9C, FIG. 9D, FIG. 9E, and FIG. 9F illustrate examples of internal components of a pixel cell of FIG. 8 and their operations.
Figure 9B:
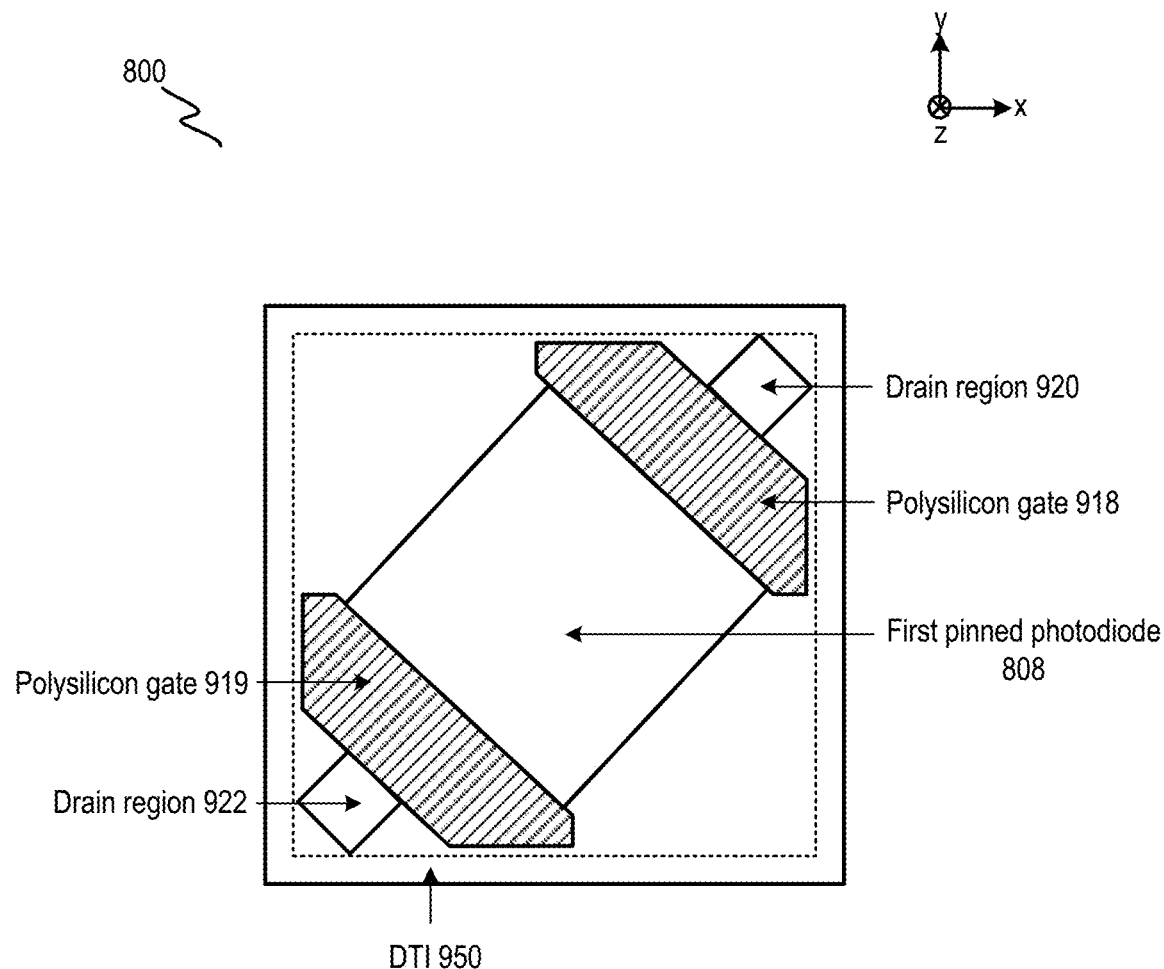

Reference is now made to FIG. 9A-FIG. 9F, which illustrate examples of other components of pixel cell 800 not shown in FIG. 8 which can support an indirect time-of-flight measurement operation. FIG. 9A illustrates a cross section view of pixel cell 800, whereas FIG. 9B illustrates a top view of pixel cell 800. In FIG. 9A, semiconductor substrate 802 can have a front side surface 902 and a back side surface 904. Front side surface 902 is where additional semiconductor processing, such as formation of polysilicon gates 918 and 919, doping and/or ion implantation to form first photodiode 808, second photodiode 810, a barrier layer 914, drain regions 920 and 922, pinning layer 924 and 926, etc. In FIG. 9A, pixel cell 800 can be configured as a back side illuminated (BSI) device, in which back side surface 904 is configured as light receiving surface 806, and microlens 832 and optical filter 834 can be placed on back side 904 surface to control the properties of first light component 822 and second light component 824 of light 816.

In the example of FIG. 9A, first photodiode 808 and second photodiode 810 can be configured as pinned photodiodes. In FIG. 9A, pixel cell 800 includes a P-well 908 and an N-type region 912 embedded within P-well 908 to form first photodiode 808. Moreover, second photodiode 810 can be formed by including an N-type region 906 embedded within P-type semiconductor substrate 802. In FIG. 9A, N-type region 912 is further away from back side surface 904 (configured as light receiving surface 806) than N-type region 906, which allows first photodiode 808 to primarily detect an infra-red component (e.g., first light component 822) of light 816 and second photodiode 810 to primarily detect a visible light component (e.g., second light component 824) of light 824. First photodiode 808 and second photodiode 810 can have the same or different pinning voltages (e.g., maximum voltage difference across the photodiodes). In both first photodiode 808 and second photodiode 810, the complete isolation of N-type region 906 and N-type region 912 within P-type substrate 901 and P-well 908 can provide better dark-current and noise performance. In addition, as shown in FIG. 9B, pixel cell 800 can be surrounded by a deep trench isolation (DTI) structure 950 to isolate first photodiode 808 and second photodiode 810 of neighboring pixel cells to reduce crosstalk between neighboring pixels, which can further improve the noise performance of the pixel cells.

In FIG. 9A, barrier layer 914 is also formed between first photodiode 808 and second photodiode 810, and first photodiode 808, barrier layer 914, and second photodiode 810 can form a stack along a direction of propagation of light within P-type semiconductor substrate 802 (e.g., along the z-axis). Barrier layer 914 can have an electrical potential configured to prevent a charge stored/generated in first photodiode 808 from entering second photodiode 810. Barrier layer 914 can also regulate flow of charge from second photodiode 810 to first photodiode 808 for read out and quantization. In some examples, barrier layer 914 can be a P-type layer and be part of P-well 908 (or P-type semiconductor substrate 802), or can be part of a P+ region with a higher P-type doping concentration. In some examples, barrier layer 914 can also be an N-type layer (e.g., having a lower N-type doping concentration than both N-type region 906 and N-type region 912). In addition, pinning layers 924 and 926 can be configured to separate, respectively, N-type region 912 and N-type region 906 from directly interfacing with front side surface 902 and back side surface 904 to reduce dark current caused by surface-hole combination at the interfaces, which can further improve the dark current performance of the first pinned photodiode. In some examples, pinning layer 924 can form the second pinned photodiode with N-type region 912, whereas pinning layer 926 can form the first pinned photodiode with N-type region 906. Further, polysilicon gate 918 can be positioned over a channel region 932 between N-type region 912 (or pinning layer 924) and drain region 920, whereas polysilicon gate 919 can be positioned over a channel region 934 between N-type region 912 (or pinning layer 924) and drain region 922. Polysilicon gates 918 and 919 can be positioned at the corners of pixel cell 800, as shown in FIG. 9B, or can be positioned on the sides of pixel cell 800.

Polysilicon gate 918 can receive a first control signal (e.g., a first voltage pulse) and exert an electric field, via oxide layer 916, to create a first channel in a channel region 932 between N-type region 912 and drain region 920, to transfer the charge generated by first photodiode 808 to drain region 920. Moreover, polysilicon gate 919 can receive a second control signal (e.g., a second voltage pulse) and exert an electric field, via oxide layer 916, to create a second channel in a channel region 934 between N-type region 912 and drain region 922, to transfer the charge generated by first photodiode 808 to drain region 922.

Figure 9C:
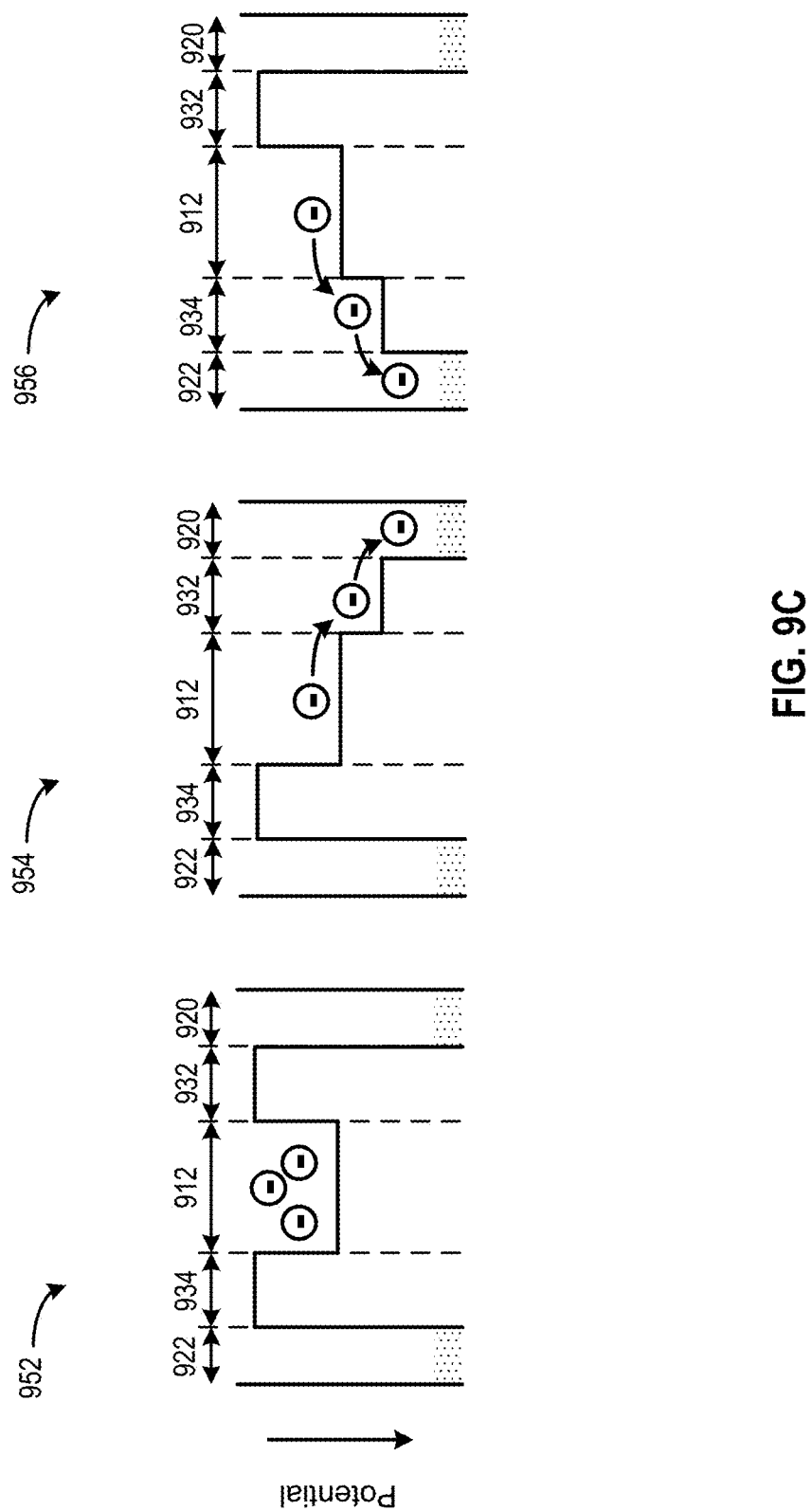

The first control signal and the second control signal can be configured to modulate the charge generated by first photodiode 808 based on changing the electrical potentials of channel region 932 and 934. FIG. 9C illustrates the change of the electrical potential across drain region 922, channel region 932, N-type region 912 (of first photodiode 808), channel region 934, and drain region 920. In operation 952, the first and second control signal can be in a de-asserted state. Both channel regions 932 and 934 can have a low electrical potential and no channel is formed. Negative charge generated at N-type region 912 can be trapped there. In operation 954, which can occur in a first readout period, polysilicon gate 918 can transmit the first control signal in an asserted state to pull up the electrical potential of channel region 934 to establish a channel there, and to transfer charge generated by first photodiode 808 in the first reflected signal readout period via the channel in channel region 932 to drain region 920, while the second signal at polysilicon gate 919 remains in the de-asserted state. In operation 956, which can occur in a second readout period, polysilicon gate 919 can transmit the second control signal in an asserted state to pull up the electrical potential of channel region 934 to establish a channel there, and to transfer charge generated by first photodiode 808 in the second reflected signal readout period via the channel in channel region 934 to drain region 922. The first readout period and the second readout period can be synchronized with the transmission of an infra-red light signal transmitted at illuminator 602 (e.g., one signal of infra-red light signal sequence 748), such that the charge generated by first photodiode 808 in both reflected signal readout periods represents the reflected infra-red light signal. Under the effect of the first control signal and the second control signal via polysilicon gates 918 and 919, the charge representing the reflected infra-red light signal is modulated into a first portion and a second portion, with the first portion generated and transferred to drain region 920 in the first readout period (in operation 954) and the second portion generated and transferred to drain region 922 in the second readout period (in operation 956). As to be described in detail below, the first portion of the charge and the second portion of the charge can be used by 3D measurement module 624 to determine a phase difference between the transmitted infra-red light signal and the reflected infra-red light signal for an indirect ToF measurement operation.

Figure 9D:
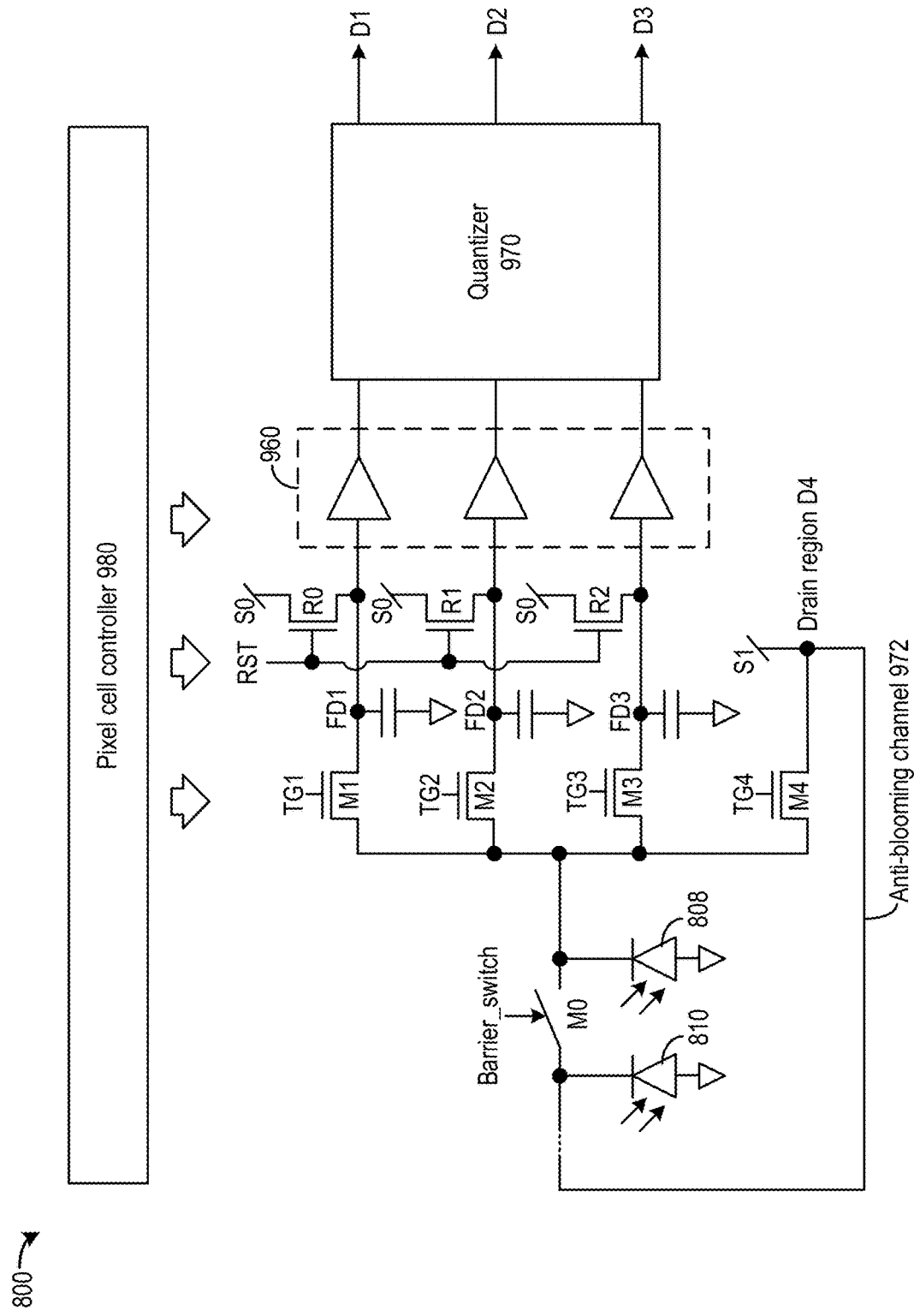
Figure 9E:
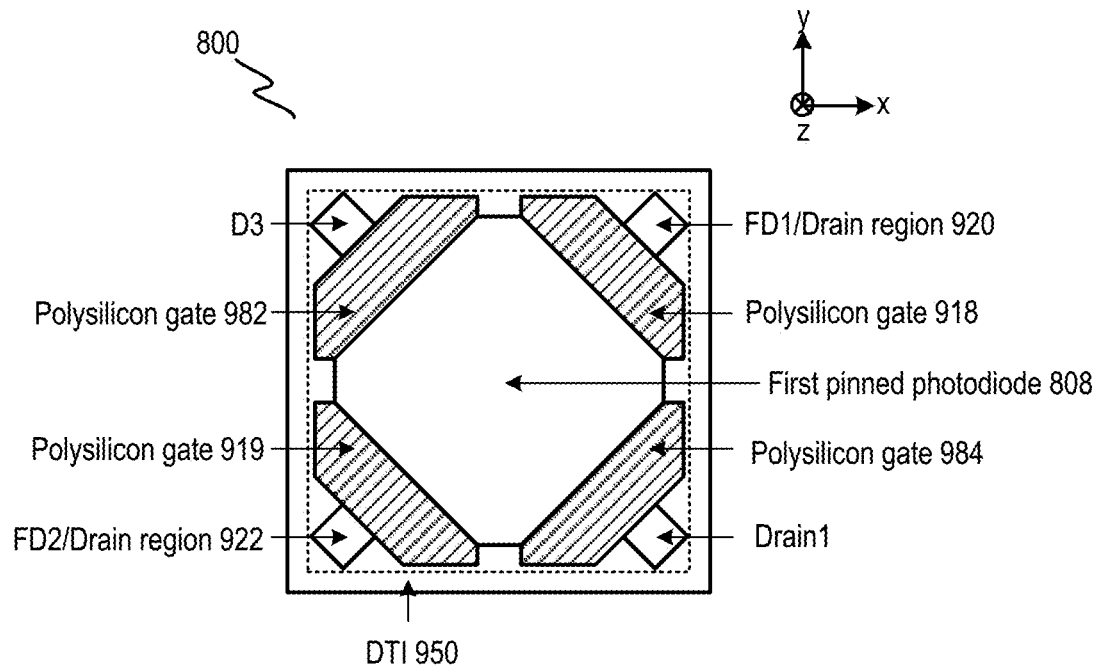
Figure 9E:
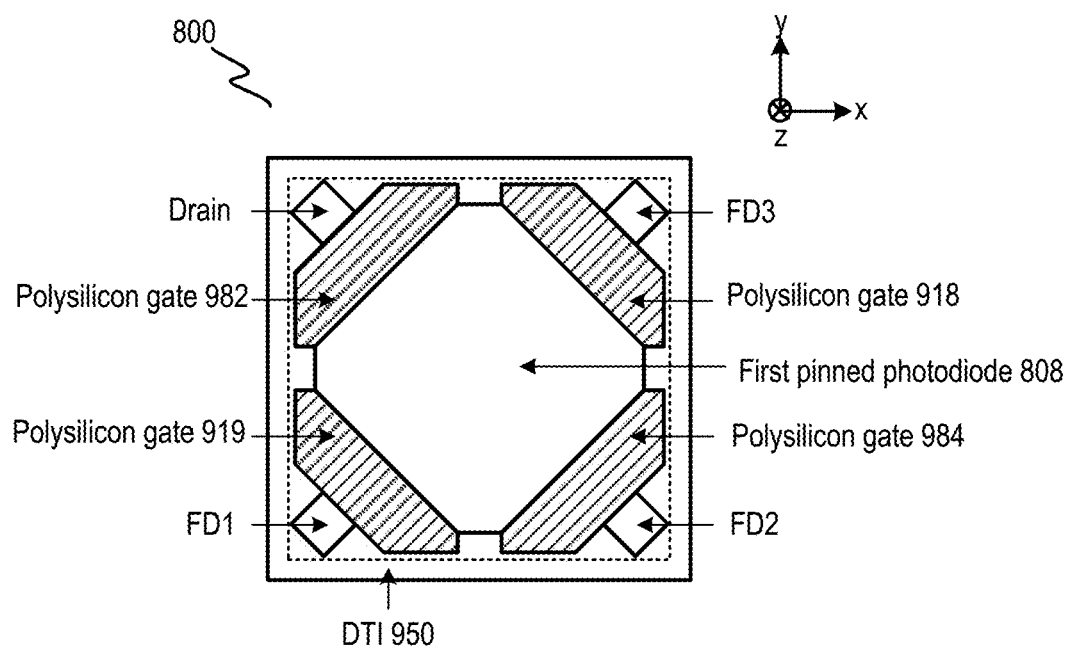

In some examples, pixel cell 800 can include additional drain regions and polysilicon gates to perform additional modulation operations, and to reset the photodiodes to prepare for a measurement operation. FIG. 9D illustrates a schematic view of pixel cell 800 including additional drain regions and polysilicon gates not shown in FIG. 9A, whereas FIG. 9E illustrates the top side views of examples of pixel cell 800 including drain regions and polysilicon gates. As shown in FIG. 9C, pixel cell 800 includes first photodiode 808 and second photodiode 810, switch M0, transistors M1-M4 and R0-R2, all of which can be implemented in first semiconductor substrate 802 of FIG. 8. In addition, pixel cell 800 includes a quantizer 970 and a pixel cell controller 980, both of which can be part of interface circuit 850 implemented in second semiconductor substrate 804 of FIG. 8.

In FIG. 9D, first photodiode 808 and second photodiode 810 is separated by a switch M0 which can represent barrier layer 914 controlled by a signal labelled barrier switch. Moreover, first photodiode 808 is connected to a transistor M1, a transistor M2, a transistor M3, and a transistor M4, wherein each has a polysilicon gate formed on front side surface and a drain region formed under the front side surface. Transistor M1 can include polysilicon gate 918, channel region 932, and a floating drain FD1 which corresponds to drain region 920 in FIG. 9A. Transistor M0 can be controlled by a control signal TG1. Moreover, transistor M2 can include polysilicon gate 919, channel region 934, and a floating drain FD2 which corresponds to drain region 922 in FIG. 9A. Transistor M2 can be controlled by a control signal TG2.

Further, transistor M3 includes a polysilicon gate 982 and a drain region, which can be configured as a floating drain FD3 or a drain region D3 connected to charge sink. Transistor M3 can be controlled by a control signal TG3 via polysilicon gate 982. The control signals TG1, TG2, and TG3 can be asserted at different readout periods to modulate the charge generated by the first photodiode 808 into a first portion, a second portion, and a third portion. The first portion of the charge can be stored in floating drain FD1, the second portion of charge can be stored in floating drain FD2, whereas the third portion of the charge can be stored in floating drain FD3. Each of FD1, FD2, and FD3 can include a capacitor configured as a charge sensing device to convert the stored charge into a voltage, which can be buffered by buffers 960, which can be unity-gain buffers, source followers, etc., and quantized by a quantizer 970 to generate, respectively, quantization outputs D1, D2, and D3. Each of FD1, FD2, and FD3 can be reset by a respective reset transistor R0, R1, or R2, each controlled by a reset signal RST and connected to a charge sink S0 to remove the charge. Further, transistor M4 is connected to first photodiode 808 and second photodiode 810.

In addition, M4 includes a polysilicon gate 984 and a drain region D4 connected to a charge sink S1 and can be controlled by a control signal TG4 via polysilicon gate 984 to reset first photodiode 808, as well as second photodiode 810 (when switch M0 is enabled). In some examples, drain region D3 of M3 can also be connected to charge sink S1 to speed up the resetting of first photodiode 808 and second photodiode 810. Control signal TG4 can also set an integration period of the photodiodes. In some examples, as shown in FIG. 9D, drain region D4 can be connected to second photodiode 810 via an optional anti-blooming channel 972 to remove excessive charge from second photodiode 810 (e.g., when the intensity of the visible light is too high) and to prevent the excessive charge from leaking into first photodiode 808 and/or into an adjacent pixel. Referring back to FIG. 9A, the anti-blooming channel can include a strip of lightly doped N-type material connected between N-type region 906 and drain region D4 across barrier layer 914.

Further, pixel cell 800 includes pixel cell controller 980 to transmit the control signals barrier_switch, TG1, TG2, TG3, TG4, and RST. The timing and sequence of the control signals can be configured to provide collocated 2D and 3D sensing, with 3D sensing performed based on an indirect ToF measurement operation. Pixel cell controller 980 can also control the operations of quantizer 970 to generate quantization outputs D1, D2, and D3. For example, in a case where quantizer 970 supports correlated double sampling (CDS), pixel cell controller 980 can control quantizer 970 to obtain a sample of noises (e.g., reset noise, comparator offset noise, etc.), combine with samples of the charge stored in FD1, FD2, and FD3 to compensate for the noises, and perform quantization on the noises-compensated samples.

Figure 9F:
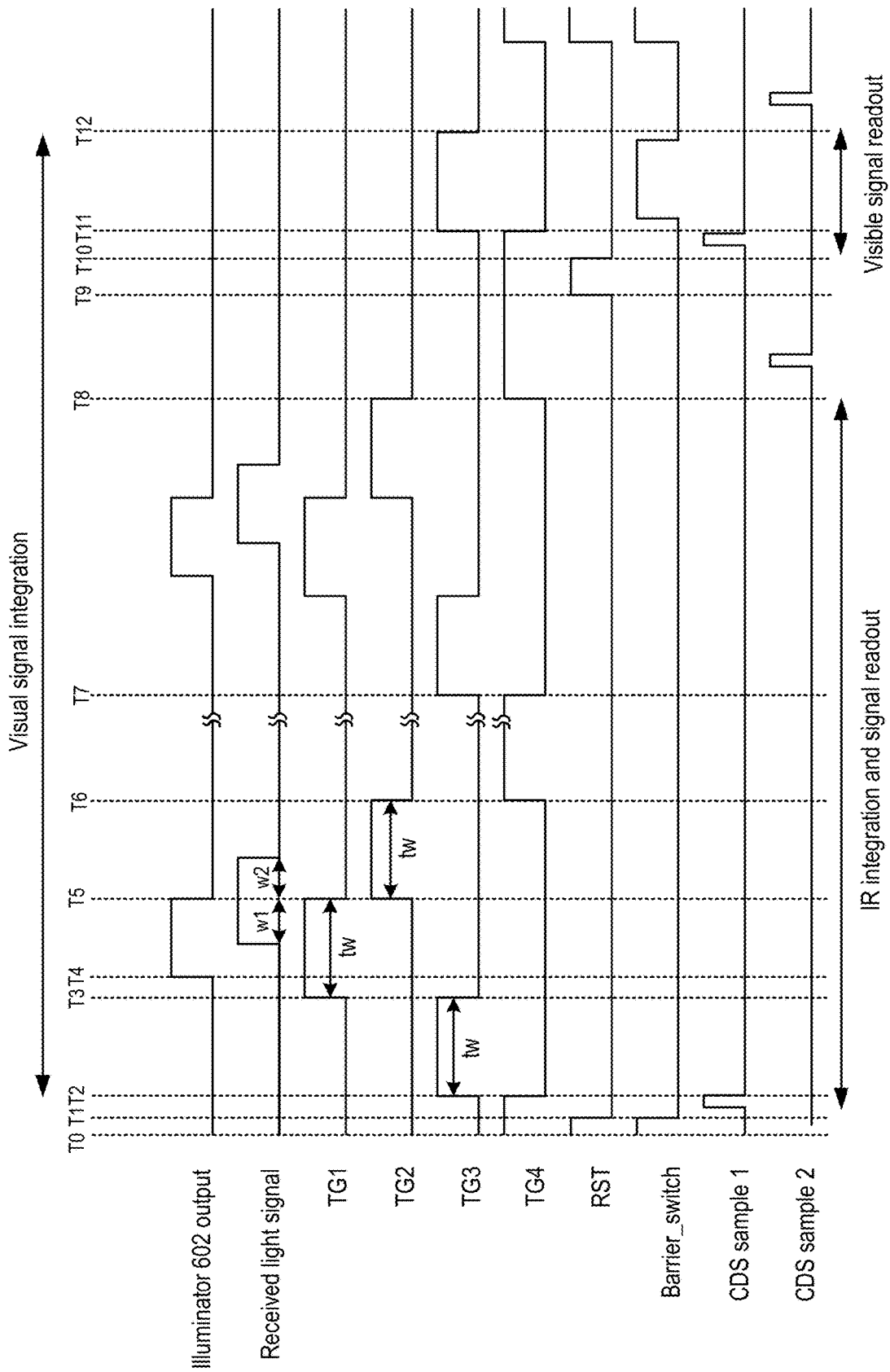

FIG. 9F illustrates a sequence of control signals provided by pixel cell controller 980 and sensing controller 610 (of FIG. 6) for the transistors and switches of pixel cell 800 as shown in FIG. 9D, to perform collocated 2D and 3D sensing. Between times T0 and T1 pixel cell 800 can be in a reset state where the RST signal is asserted to reset FD1, FD2, and FD3, whereas TG4 and barrier_switch are asserted to bias both first photodiode 808 and second photodiode 810. At time T1, barrier_switch is de-asserted to isolate first photodiode 808 from second photodiode 810, whereas the RST signal is de-asserted to allow FD1, FD2, and FD3 to store charge, including the reset noise charge. Between times T1 and T2, quantizer 970 can obtain a CDS sample of the reset noise charge stored in each of FD1, FD2, and FD3.

At time T2, TG4 is de-asserted to enable the pinned photodiodes to generate charge in response to incident infra-light, which can include background infra-red light signal as well as crosstalk from visible light received at this time. Time T2 can be the beginning of the integration period for both infra-red light sensing (by first photodiode 808) and visible light sensing (by second photodiode 810). Moreover, TG3 can be asserted at time T2 which starts a background signal readout period that ends at time T3. The width of background signal readout period is labelled as tw in FIG. 9F. Between times T2 and T3, charge generated by first photodiode 808 in response to the background infra-red light and visible light crosstalk is transferred to drain region FD3. The quantity of charge stored in FD3, Q3, can represent the background infra-red light signal. Q3 can be represented by the following equation:

$$Q_3 = I_{bg\_IR} + I_{cross\_vis} \quad \text{(Equation 1)}$$

In Equation 1, $I_{bg\_IR}$ can represent the charge contributed by background infra-red light signal, whereas $I_{cross\_vis}$ can represent the charge contributed by visible light crosstalk.

At time T3, TG3 is de-asserted to stop the background infra-red light signal and visible light crosstalk measurement. TG1 can be asserted to start a first reflected signal readout period for reflected infra-red light signal.

Between times T4 and T5, sensing controller 610 can control illuminator 602 to transmit an infra-red light signal (such as an infra-red light pulse). The transmission ends at time T5.

At time T5, TG1 is also de-asserted to end the first reflected signal readout period. Within the first reflected signal readout period between times T3 and T5, charge generated by first photodiode 808 from detection of the reflected infra-red signal can be transferred via channel region 932 to FD1 (drain region 920). The quantity of charge generated and stored in drain region FD1 within the first reflected signal readout period, Q1, can correspond to a first width w1 of the reflected infra-red signal with respect to time T5. Assuming the first reflected signal readout period has the same width tw as the background signal readout period to ensure a uniform time scale, Q1 can be adjusted by directly subtracting away Q3 to account for only the component contributed by the reflected infra-red signal, as follows:

$$Q'_1 = Q_1 - (I_{bg_{IR}} + I_{cross_{vis}}) = Q_1 - Q_3 \quad \text{(Equation 2)}$$

Moreover, at time T5, TG2 is asserted to start a second reflected signal readout period, which ends at time T6. Within the second reflected signal readout period between times T5 and T6, charge generated by first photodiode 808 from detection of the reflected infra-red signal can be transferred via channel region 934 to FD2 (drain region 922). The quantity of charge generated and stored in drain region FD2 within the second reflected signal readout period, Q2, can correspond to a second width w2 of the reflected infra-red signal with respect to time T5. Assuming the second reflected signal readout period has the same width tw as the background signal readout period (and the first reflected signal readout period) to ensure a uniform time scale, Q2 can be adjusted by subtracting away Q3 to account for only the component contributed by the reflected infra-red signal, as follows:

$$Q'_2 = Q_2 - (I_{bg_{IR}} + I_{cross_{vis}}) = Q_2 - Q_3 \quad \text{(Equation 3)}$$

The phase difference between the reflected infra-red signal and the transmitted infra-red signal can be represented by width w1, which can be represented by Q1'. The phase difference can be converted in time as follows:

$$t_d = \frac{Q'_2}{Q'_1 + Q'_2} \times t_1 \quad \text{(Equation 4)}$$

In equation 4, $t_d$ is the phase difference in time, whereas $t_l$ represents the full width (in time) of the transmitted infra-red light signal. The phase difference can represent a result of indirect ToF measurement.

The depth d can be calculated based on the phase difference $t_d$ and speed of light c according to the following equation:

$$d = \frac{c \times t_d}{2} \quad \text{(Equation 5)}$$

Combining Equations 1 to 5, the depth d can be calculated based on charge Q1, Q2, and Q3 as follows:

$$d = \frac{c}{2} \times t_1 \times \frac{Q_2 - Q_3}{Q_1 + Q_2 - 2Q_3} \quad \text{(Equation 6)}$$

In Equation 6, $Q_1 + Q_2 - 2Q_3$ can represent the total charge contributed by the reflected infra-red light signal, which corresponds to the full width of the light signal, whereas $Q_2 - Q_3$ can represent the charge contributed by the portion of reflected infra-red light signal having width w1. Q1, Q2, and Q3 can be represented by quantization outputs D1, D2, and D3 from quantizer 970. The computation of depth d can be performed at, for example, 3D measurement module 624 of FIG. 6.

At time T6, TG4 can be asserted to end the integration time for first photodiode 808. The charge Q1, Q2, and Q3 can represent charge generated by first photodiode 808 within the integration time between T1 and T6 and modulated by control signals TG1, TG2, and TG3 at different times.

To ensure that the depth measurement is based on sufficient quantity of charge such that the measurement is less susceptible to noise, the operations between T1 and T6 can be repeated for multiple cycles, such as between times T7 and T8, where one infra-red light signal is transmitted and one reflected infra-red light signal is measured in each cycle. After n number of cycles, charge n×Q1, n×Q2, and n×Q3 can be stored in, respectively, FD1, FD2, and FD3. The charge stored in the drain regions can be quantized by quantizer 970. The depth d can be calculated based on the additional charge as follows:

$$d = \frac{c}{2} \times t_1 \times \frac{n \times Q_1 - n \times Q_3}{n \times Q_1 + n \times Q_2 - 2(n \times Q_3)} \quad \text{(Equation 7)}$$

After the indirect ToF measurement completes (e.g., at time T8), pixel cell controller 980 can control pixel cell 800 to perform visible light readout. Specifically, between times T9 and T10, the RST signal can be asserted to reset drain regions FD1, FD2, and FD3, followed by sampling of reset noise at FD3 between times T10 and T11. Between times T11 and T12, both TG3 and barrier switch is asserted, which allows charge stored in second photodiode 810 from exposure of visible light between times T1 and T12 to be transferred via first photodiode 808 to drain FD3 for readout. The charge, $Q_{visual}$, can then be quantized by quantizer 970 to generate quantization output D3.

The charge generated by second photodiode 810, although mostly caused by exposure to visible light, may include infra-red crosstalk components contributed by background infra-red light signals as well as reflected infra-red light signals. To improve the accuracy of visible light measurement, the infra-red crosstalk components can be removed from the visible light charge readout result.

The infra-red crosstalk components can be computed in two steps. In a first step, the infra-red crosstalk component contributed by the reflected infra-red light $Q_{crosstalk\_reflectedIR}$ can be computed by scaling the total charge contributed by the reflected infra-red light signal, $Q_1+Q_2-2Q_3$, by a ratio between the spectral response of the second photodiode 810, $S_{810}$, and the spectral response of the first photodiode 808, $S_{808}$, for the frequency range of the reflected infra-red light signal, as follows:

$$Q_{crosstalk\_reflectedIR} = (Q_1 + Q_2 - 2Q_3) \times \frac{S_{810}}{S_{808}} \quad \text{(Equation 8)}$$

The scaling can reflect that both first photodiode 808 and second photodiode 810 receive the same reflected infra-red light signal, but have different spectral response such that they generate different quantities of charge in response to the infra-red light signal. The reflected infra-red light component can be subtracted from the visible light charge $Q_{visual}$ to obtain corrected visual charge $Q_{visual\_comp\_reflectedIR}$ as follows:

$$Q_{visual\_comp\_reflectedIR} = Q_{visual} - Q_{crosstalk\_reflectedIR} \quad \text{(Equation 9)}$$

In a second step, the infra-red crosstalk component contributed by the background infra-red light signal can be computed based on $Q_3$ and $Q_{visual\_comp\_reflectedIR}$. As described above, $Q_3$ represents the charge contributed by both background infra-red light signal as well as visible light crosstalk. The charge contributed by background infra-red light signal can be computed by scaling $Q_3$ up to account for the different widths of background signal readout (tw) and integration time of visual light (between times T2 to T11), and the infra-red crosstalk component contributed by the background infra-red light signal can be removed from $Q_{visual\_comp\_reflectedIR}$ as well.

Figure 10A:
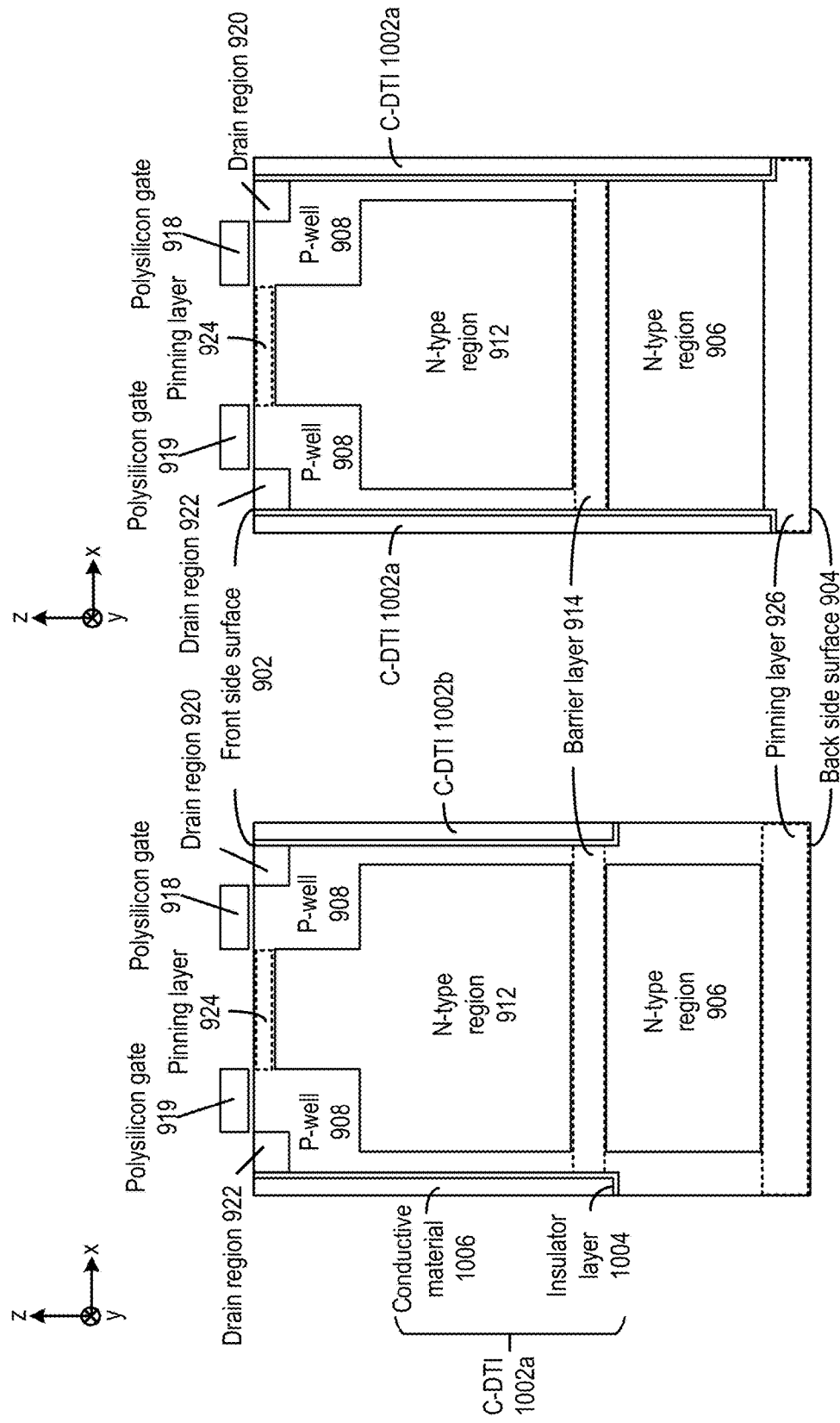
FIG. 10A and FIG. 10B illustrate additional components of the example pixel cell of FIG. 9A, FIG. 9B, FIG. 9C, FIG. 9D, FIG. 9E, and FIG. 9F.
Figure 10B:
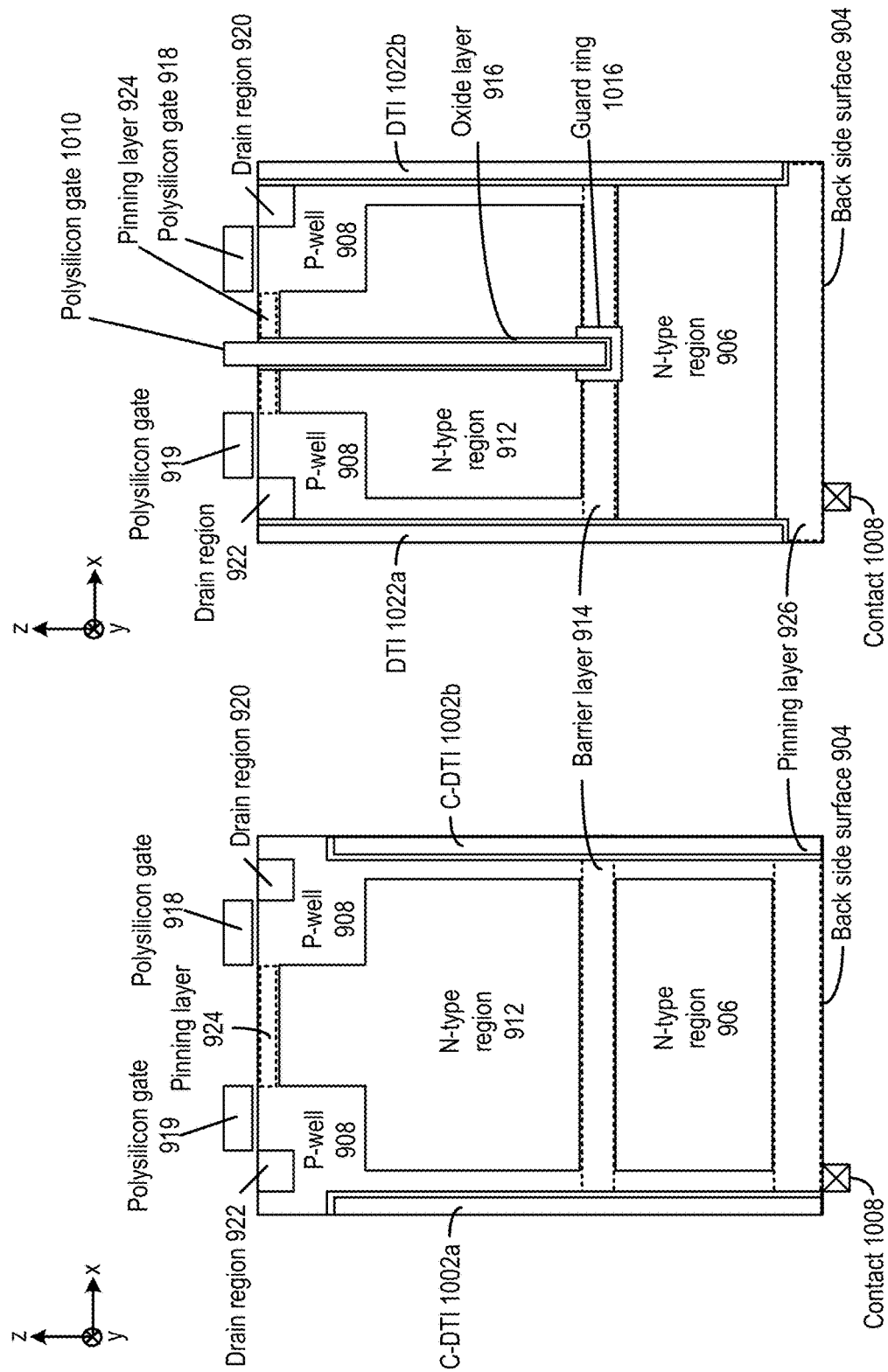

FIG. 10A and FIG. 10B illustrate examples of pixel cell 800 having components to control the electrical potential of barrier layer 914. As shown in FIG. 10A, pixel cell 800 can include conductive deep trench insulations (C-DTI) 1002a and 1002b that extend from front side surface 902 into first semiconductor substrate 802 along a vertical direction (e.g., parallel with the z-axis). The C-DTI includes an insulator layer 1004 (e.g., an oxide layer) and a conductive material 1006 (e.g., polysilicon). C-DTI 1002a and 1002b can reach the lateral sides of barrier layer 914. Each of C-DTI 1002a and 1002b can conduct a signal received from front side surface 902 to form a lateral electric field (e.g., parallel with the x/y axes) across barrier layer 914, which can push out charge from barrier layer 914 to adjust its electrical potential. C-DTI 1002a and 1002b can also provide insulation between photodiodes of adjacent pixel cells. As shown on the left of FIG. 10A, C-DTI 1002a and 1002b can reach the lateral sides of P-well 908 and N-type region 912 (of first photodiode 808) and barrier layer 914, to provide insulation for first photodiode 808 and barrier layer 914. Moreover, as shown on the right of FIG. 10A, C-DTI 1002a and 1002b can extend across barrier layer 914 and reach the lateral sides of N-type region 906, to provide insulation for second photodiode 810 as well.

FIG. 10B illustrates other examples of pixel cell 800 to control the electrical potential of barrier layer 914. As shown on the left of FIG. 10B, C-DTI 1002a and 1002b can extend from back side surface 904 to insulate first semiconductor substrate 802, N-type region 906, barrier layer 914, N-type region 912, and P-well 908. Such arrangements can further improve insulation between adjacent pixel cells. One or more contacts 1008 can be provided on back side surface 904 to provide access to C-DTI 1002a and 1002b as well as first semiconductor substrate 802.

In some examples, as shown on the right of FIG. 10B, pixel cell 800 can include a polysilicon gate 1010 that extends from front side surface 902 across N-type region 912 to reach barrier layer 914. Polysilicon gate 1010 is insulated from N-type region 912 and barrier layer 914 by oxide layer 916. Polysilicon gate 1010 can conduct a voltage to barrier layer 914. The voltage can assert an electrical field over oxide layer 916 to push out negative charge from barrier layer 914, which can adjust the electrical potential of barrier 914. Pixel cell 800 may further include a guard ring 1016 to insulate polysilicon gate 1010 from N-type region 906 to prevent the voltage from affecting the electrical potential of N-type region 906. Pixel cell 800 further includes DTI 1022a and 1022b to provide insulation between adjacent pixel cells. The DTI need not be conductive, as the DTI need not conduct an electrical field to change the electrical potential of barrier 914, which can be adjusted by polysilicon gate 1010.

Figure 11A:
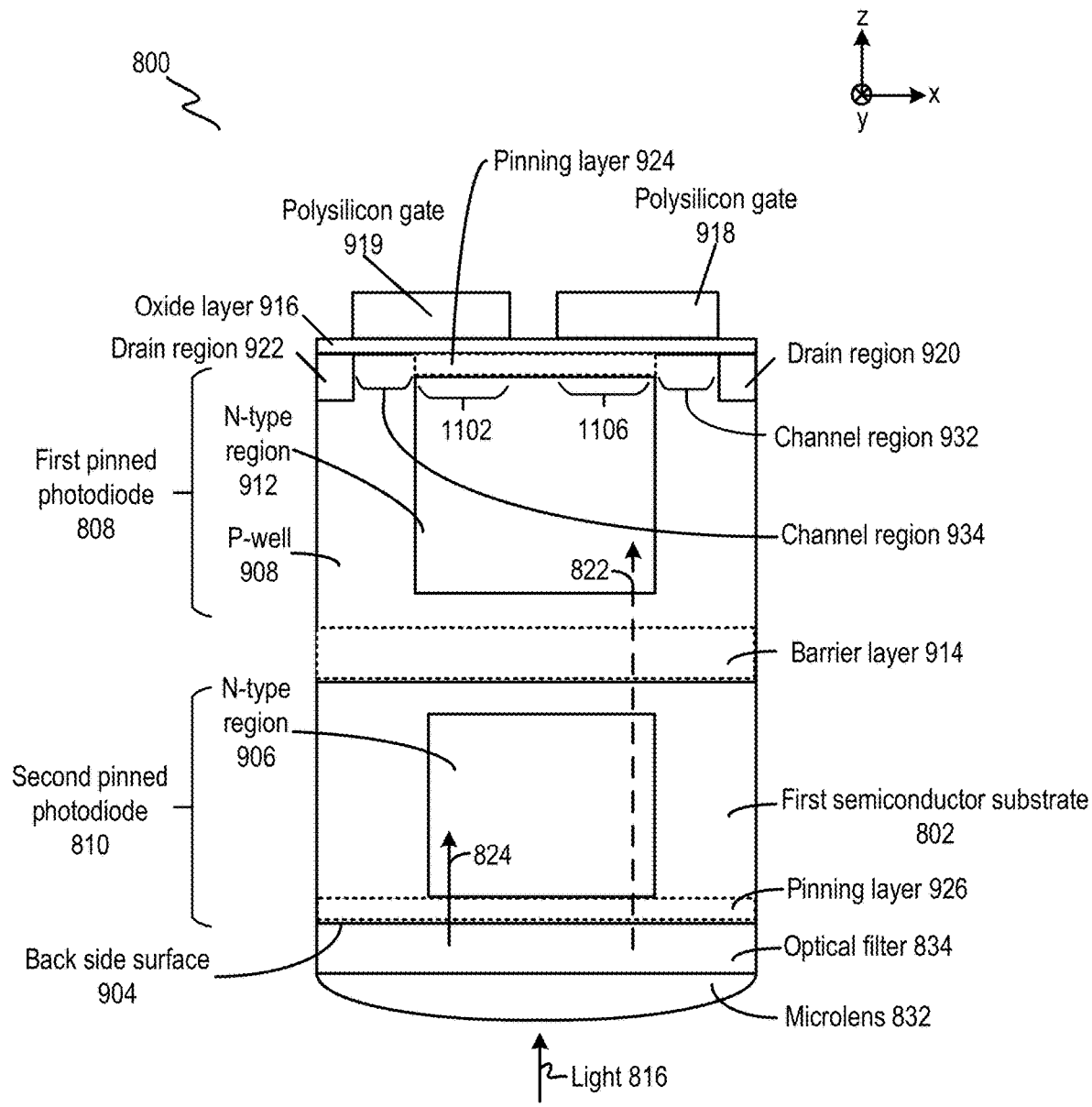
FIG. 11A, FIG. 11B, and FIG. 11C illustrate other examples of internal components of a pixel cell of FIG. 8 and their operations.
Figure 11B:
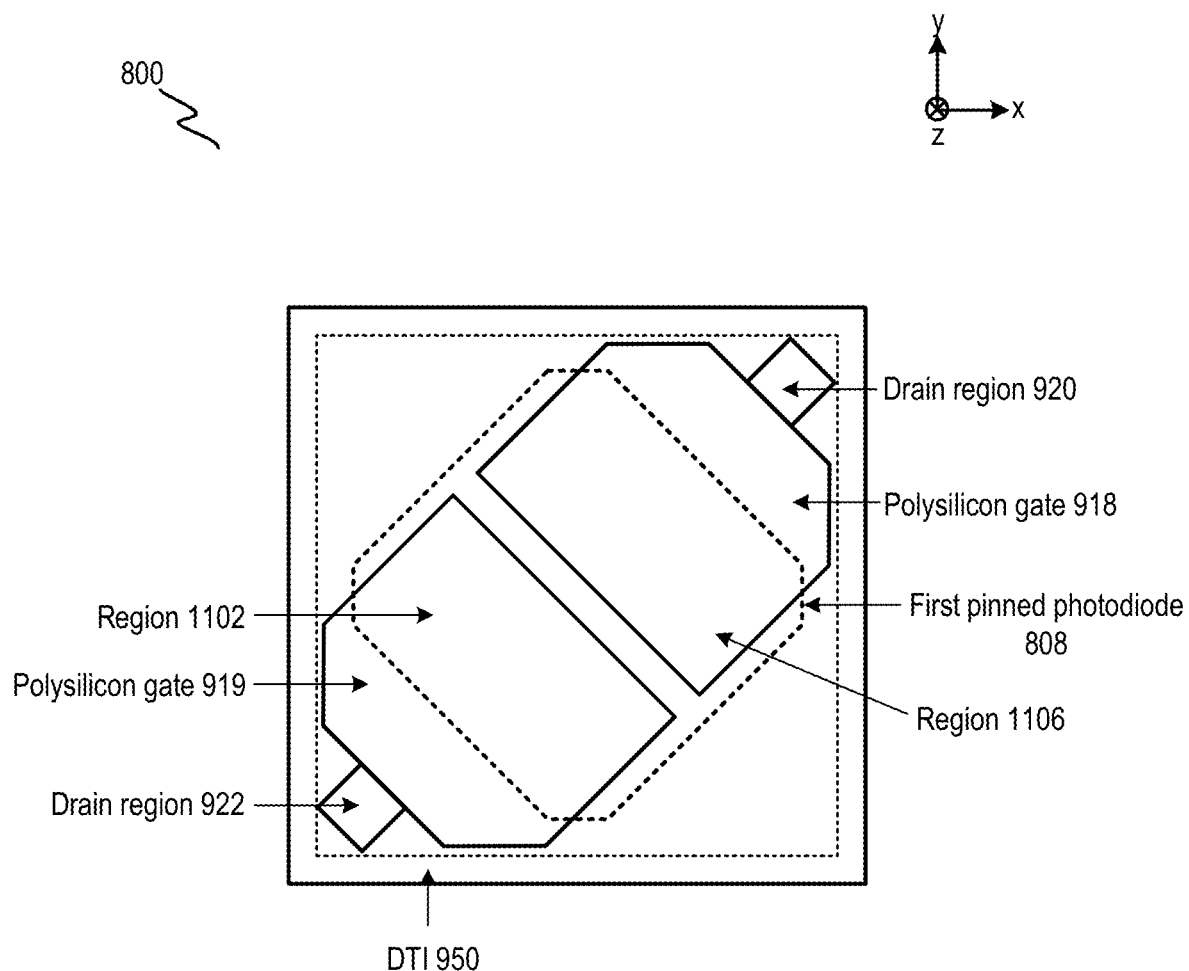
Figure 11C:
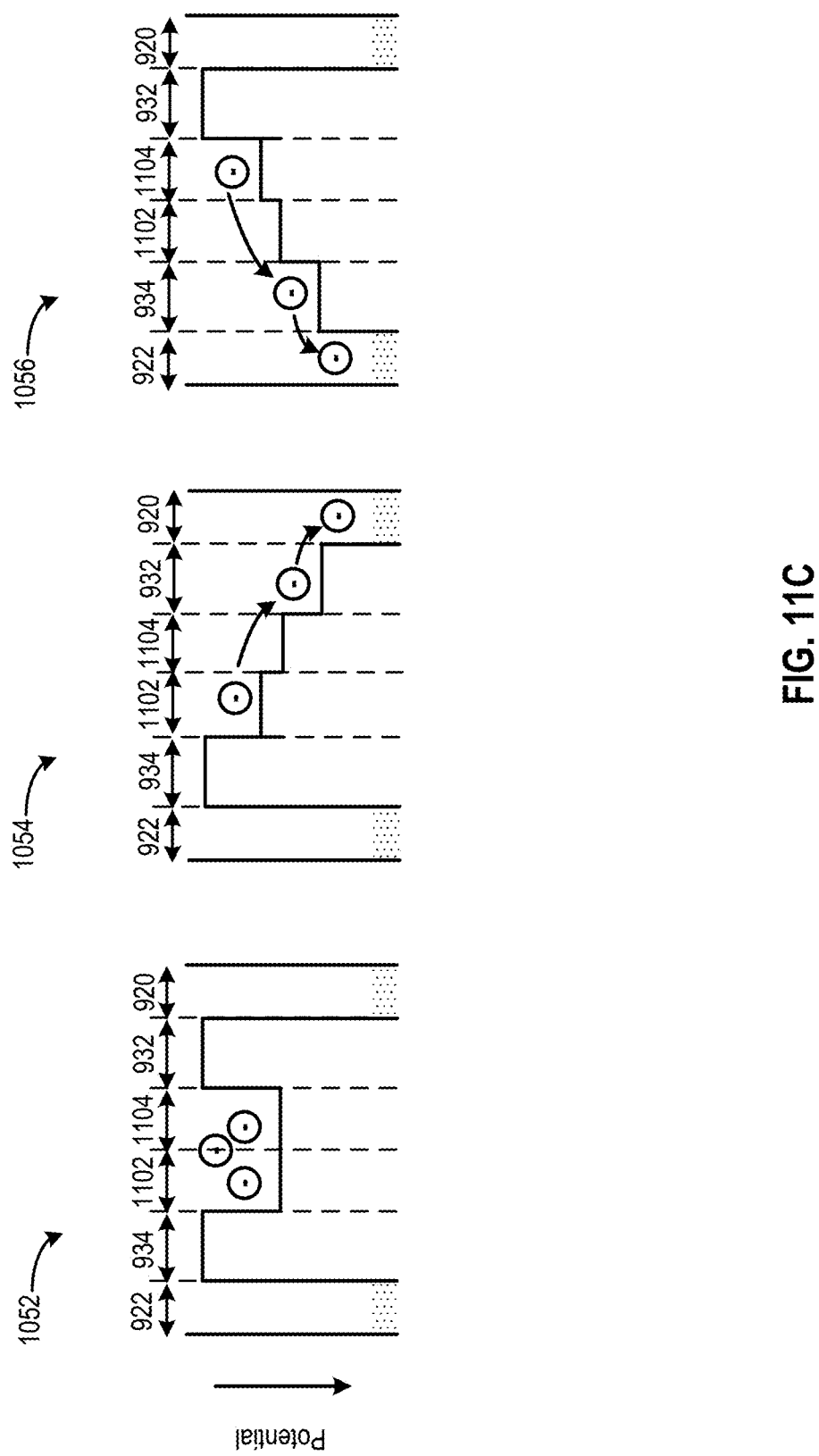

FIG. 11A-FIG. 11C illustrate additional examples of pixel cell 800. FIG. 11A illustrates a cross-sectional view of pixel cell 800, whereas FIG. 11B illustrates a top view of pixel cell 800. As shown in FIG. 11A and FIG. 11B, polysilicon gates 918 and 919 can extend along the x and y directions to overlap with N-type region 912 as well as pinned layer 924 at, for example, regions 1102 and 1106. Such arrangements enable polysilicon gates 918 and 919 to modulate not only the electrical potentials of drain regions 920 and 922 to form channels for transfer of charge, but also the electrical potentials of overlap regions 1102 and 1106 of N-type region 912 and pinning layer 924. The modulation of the electrical potential of overlap regions 1102 and 1106 can create an electrical potential within N-type region, which can speed up the flow of charge and the modulation of the charge and allows the modulation of the charge to align more closely with the end of the transmitted pulse. Such arrangements can reduce the error in the phase difference measurement introduced by the charge transfer delay.

FIG. 11C illustrates the change of the electrical potential across drain region 922, channel region 932, N-type region 912 (of first photodiode 808), channel region 934, and drain region 920 of FIG. 11A and FIG. 11B under the effect of first control signal and second control signal. In operation 1052, the first and second control signal can be in a de-asserted state. Both channel regions 932 and 934 can have a low electrical potential and no channel is formed. Negative charge generated at N-type region 912 can be trapped there.

In operation 1054, which can occur in a first readout period, polysilicon gate 918 can transmit the first control signal in an asserted state to pull up the electrical potential of channel region 934 to establish a channel there. Moreover, the electrical potential of overlap region 1104 is also pulled up by the first control signal. Meanwhile, the second control signal at polysilicon gate 919 remains in the de-asserted state, and the electrical potential of overlap region 1102 remains low. Such arrangements create an electrical gradient starting from overlap region 1102 to drain region 920. The electrical gradient can facilitate flow of charge within N-type region 912 towards drain region 920 and can speed up the flow of charge to drain region 920 in the first readout period.

In operation 1056, which can occur in a second readout period, polysilicon gate 919 can transmit the second control signal in an asserted state to pull up the electrical potential of channel region 934 to establish a channel there. Moreover, the electrical potential of overlap region 1102 is also pulled up by the second control signal. Meanwhile, the first control signal at polysilicon gate 918 is in the de-asserted state, and the electrical potential of overlap region 1104 is low. Such arrangements create an electrical gradient starting from overlap region 1104 to drain region 922. The electrical gradient can facilitate flow of charge within N-type region 912 towards drain region 922 and can speed up the flow of charge to drain region 922 in the second readout period.

Figure 12A:
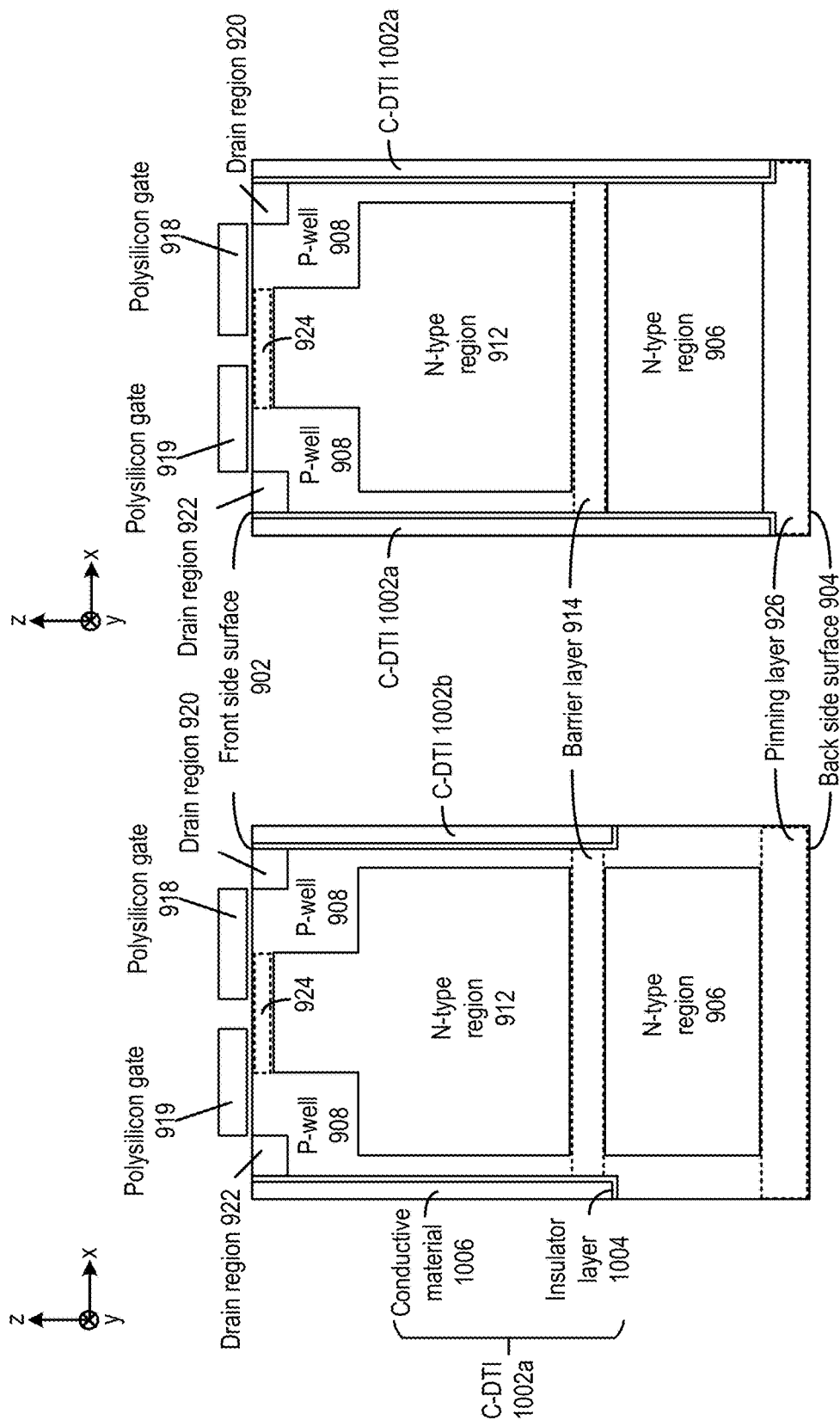
FIG. 12A and FIG. 12B illustrate additional components of the example pixel cell of FIG. 11A, FIG. 11B, and FIG. 11C.
Figure 12B:
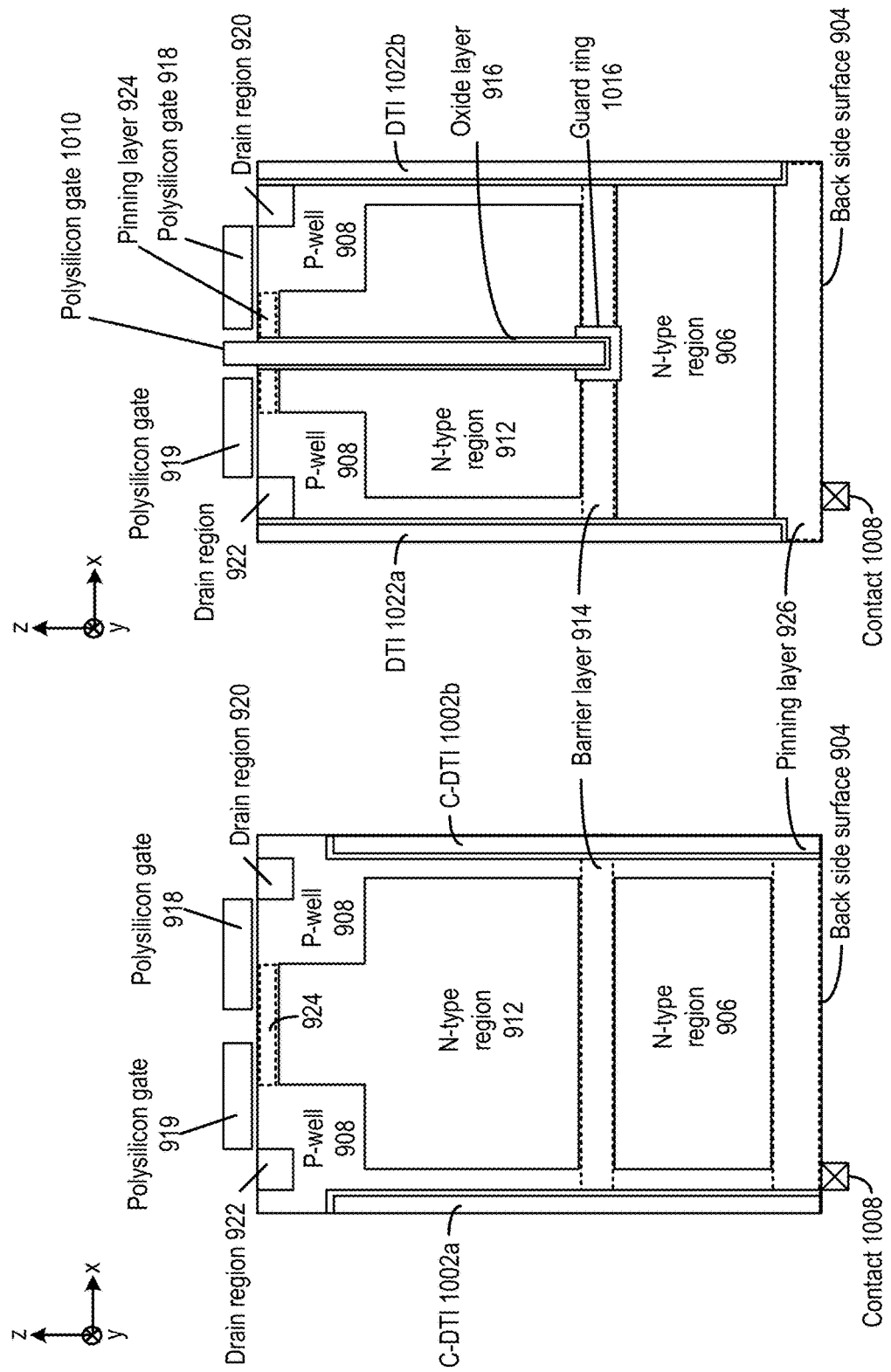

FIG. 12A and FIG. 12B illustrate examples of pixel cell 800 having extended polysilicon gates 918 and 919 as well as components to control the electrical potential of barrier layer 914 as in FIG. 11A and FIG. 11B, the descriptions for which are not repeated here.

Figure 13:
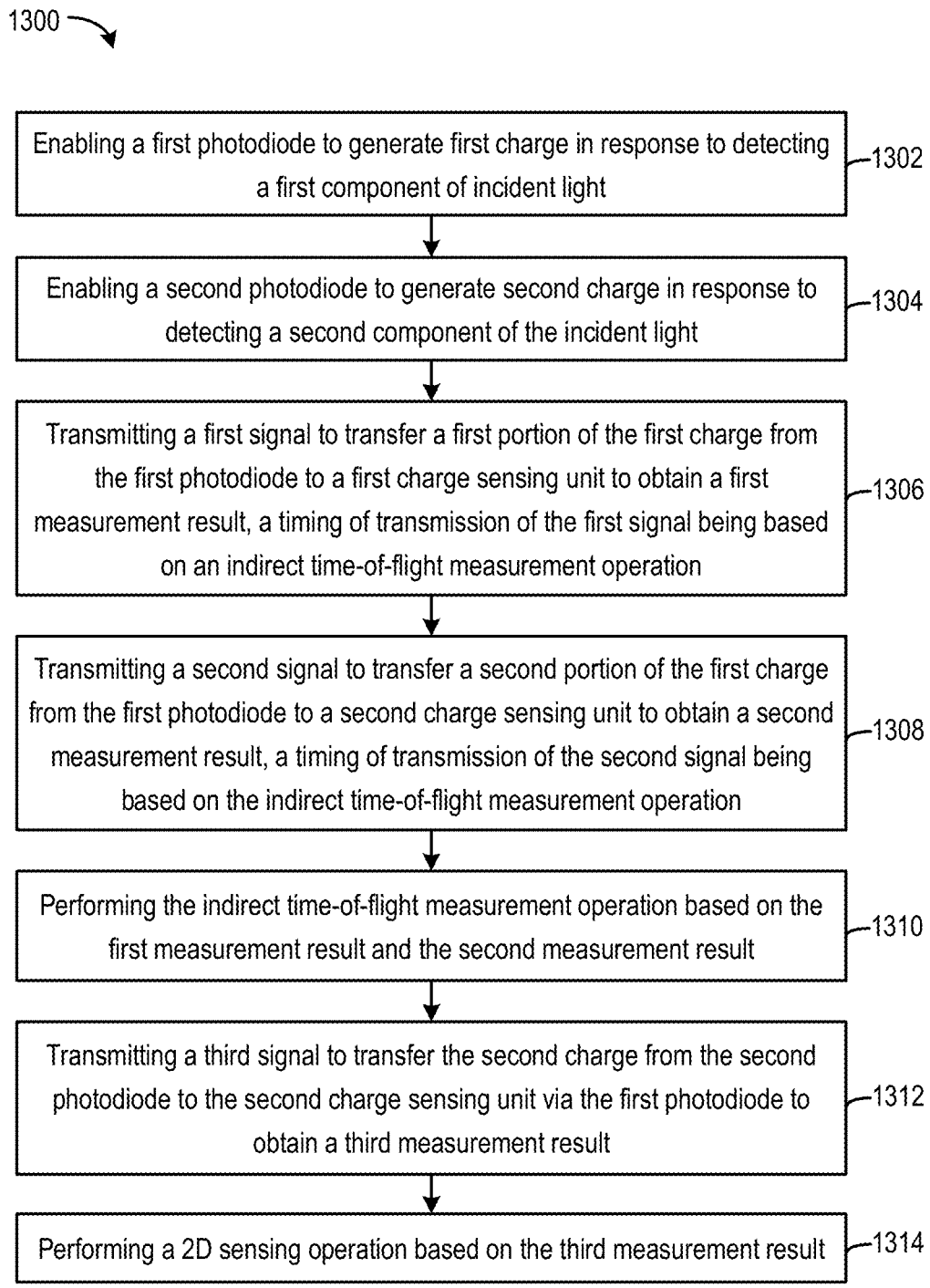
FIG. 13 illustrates a flowchart of an example method of performing image sensing.

FIG. 13 illustrates an example flowchart of a method 1300 for performing 2D and 3D sensing. Method 1300 can be performed by a controller of pixel cell 800, such as pixel cell controller 980 of FIG. 9D and measurement module 608 of FIG. 6, as well as other components of pixel cell 800 such as first photodiode 808, second photodiode 810, switch M0, transistors M1-M4 and R0-R2, and quantizer 970.

In step 1302, controller 980 can enable first photodiode 808 to generate first charge in response to a first component (e.g., an infra-red component) of incident light that enters pixel cell 800.

In step 1304, controller 980 can enable second photodiode 810 to generate second charge in response to a second component (e.g., a visible light component) of the incident light.

Prior to both steps 1302 and 1304, both first photodiode 808 and second photodiode 810 can be in a reset state with switch M0 and transistor M4 enabled, the electrical potential of the barrier layer between first photodiode 808 and second photodiode 810 can be adjusted to allow charge to flow from second photodiode 810 into first photodiode 808 (represented by enabling switch M0), and charge generated by both first photodiode 808 and second photodiode 810 can be drained away by a charge sink connected with transistor M4. To enable both first photodiode 808 and second photodiode 810 to generate, respectively, first charge and second charge in response to incident light, controller 980 can disable switch M0 and transistor M4.

In step 1306, controller 980 can transmit a first signal to transistor M1 to transfer a first portion of the first charge from the first photodiode to a first charge sensing unit (e.g., FD1) to obtain a first measurement result, a timing of transmission of the first signal being based on an indirect time-of-flight measurement operation. The timing of the first signal can correspond to a first reflected signal readout period, and the end time of the first reflected signal readout period can be synchronized with the end time of an infra-red light signal transmitted by an illuminator (e.g., illuminator 602), such that the first portion of the first charge transferred by M1 can represent a first width (e.g., w1 of FIG. 9F) of a reflected infra-red light signal reflected by an object with respect to the end time of the transmitted infra-red light signal. The first measurement result can be a voltage representing a quantity of the first portion of the first charge representing the first width, which can be used to perform the indirect time-of-flight measurement operation to measure a depth/distance from the object. In step 1306 second photodiode 810 can also accumulate the second charge in response to the visible light component of the incident light.

In step 1308, controller 980 can transmit a second signal to transistor M2 to transfer a second portion of the first charge from the first photodiode to a second charge sensing unit (e.g., FD2) to obtain a second measurement result, a timing of transmission of the second signal also being based on the indirect time-of-flight measurement operation. The timing of the second signal can correspond to a second reflected signal readout period, and the start time of the second reflected signal readout period can be synchronized with the end time of the transmission of infra-red light signal, such that the second portion of the first charge transferred by M2 can represent a second width (e.g., w2 of FIG. 9F) of the reflected infra-red light signal with respect to the end time of the transmitted infra-red light signal. The second measurement result can be a voltage representing a quantity of the second portion of the first charge representing the second width can be used to perform the indirect time-of-flight measurement operation to measure a depth/distance from the object. In step 1308 second photodiode 810 can also accumulate the second charge in response to the visible light component of the incident light.

In step 1310, controller 980 can perform the indirect time-of-flight measurement operation based on the first measurement result and the second measurement result. For example, a phase difference between the transmitted infrared light signal and the reflected infra-red light signal can be based on a ratio between the second width and a sum of the first width and the second width, and a width of the transmitted infra-red light signal. In some examples, controller 980 can also transmit a third signal to TG3 to transfer a third portion of the first charge to a third charge sensing unit (FD3). The third portion of the first charge can represent background infra-red light signal. Controller 980 can control quantizer 970 to quantize the first portion, second portion, and the third portion of the first charge to obtain, respectively, quantization outputs D1, D2, and D3. 3D measurement module 624 (of measurement module 608) can then compute the depth based on D1, D2, and D3 based on Equation 6 as described above. In some examples, The first charge can be accumulated over several frame cycles, and the depth can be computed based on the first portion, the second portion, and the third portion of the first charge accumulated over the several frame cycles based on Equation 7 as described above. The depth result can be a 3D pixel value.

In step 1312, controller 980 can transmit a third signal to TG2 to transfer the second charge from the second photodiode to the second charge sensing unit via the first photodiode to obtain a third measurement result. The transfer can be performed after the indirect time-of-flight measurement operation completes. Prior to the transfer, controller 980 can reset the second charge sensing unit (e.g., FD2) to remove the second portion of the first charge, and then transfer the second charge to the second charge sensing unit to obtain the third measurement result. The third measurement result can be a voltage representing a quantity of the second charge.

In step 1314, 2D measurement module 622 (of measurement module 608) can perform a 2D sensing operation based on the third measurement result. The voltage representing the third measurement result can be quantized by quantizer 970 to generate a 2D pixel value.

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some embodiments, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. An apparatus comprising:
    a first photodiode configured to generate a first charge in response to light of a first frequency range;
    a second photodiode configured to generate a second charge in response to light of a second frequency range;
    a barrier layer between the first photodiode and the second photodiode;
    a first charge sensing unit;
    a second charge sensing unit;
    a controller configured to:
        transfer a first portion of the first charge from the first photodiode to the first charge sensing unit to obtain a first measurement result;
        transfer a second portion of the first charge from the first photodiode to the second charge sensing unit to obtain a second measurement result;
        perform a 3D sensing operation based on the first measurement result and the second measurement result;
        transfer the second charge from the second photodiode to the second charge sensing unit via the first photodiode to obtain a third measurement result; and
        perform a 2D sensing operation based on the third measurement result.

2. The apparatus of claim 1, further comprising a first polysilicon gate and a second polysilicon gate;
    wherein:
        the first photodiode and the second photodiode are in a semiconductor substrate having a front side surface;
        the semiconductor substrate comprises:
            a first drain region configured as the first charge sensing unit,
            a first channel region connected between the first drain region and the first photodiode,
            a second drain region configured as the second charge sensing unit; and
            a second channel region connected between the second drain region and the second photodiode;

and the first polysilicon gate and the second polysilicon gate are on the front side surface and over, respectively, the first channel region and the second channel region.

3. The apparatus of claim 2, wherein the first photodiode comprises a pinning layer; and
wherein the pinning layer is connected to the first channel region and the second channel region.

4. The apparatus of claim 3, wherein:
the first polysilicon gate extends over a first region of the first photodiode connected to the first channel region;
the second polysilicon gate extends over a second region of the first photodiode connected to the second channel region; and
the controller is configured to:
transmit, via the first polysilicon gate, a first signal to modulate electrical potentials of the first region of the first photodiode and of the first channel region to transfer the first portion of the first charge to the first drain region; and
transmit, via the second polysilicon gate, a second signal to modulate electrical potentials of the second region of the first photodiode and of the second channel region.

5. The apparatus of claim 4, further comprising:
a third drain region configured as a third charge sensing unit to measure a third portion of the first charge;
a third channel region connected between the third drain region and the first photodiode; and
a third polysilicon gate on the front side surface and over the third channel region,
wherein the controller is configured to transmit, via the third polysilicon gate, a fourth signal to transfer the third portion of the first charge to the third drain region via the third channel region.

6. The apparatus of claim 5, further comprising:
a fourth drain region configured as a charge sink to reset at least one of the first photodiode or the second photodiode;
a fourth channel region connected between the fourth drain region and the first photodiode; and
a fourth polysilicon gate on the front side surface and over the fourth channel region to transmit a fifth signal to reset the first photodiode.

7. The apparatus of claim 6,
wherein the barrier layer is configured to block the first charge from flowing into the second photodiode; and
wherein the barrier layer is controllable by a sixth signal to control a flow of the second charge from the second photodiode to the first photodiode.

8. The apparatus of claim 1, wherein the apparatus further comprises an infra-red illuminator to transmit a first infra-red light pulse;
wherein the first photodiode is configured to generate the first charge based on detecting a second infra-red light pulse from reflection of the first infra-red light pulse; and
wherein the controller is configured to:
control the infra-red illuminator to transmit the first infra-red light pulse between a first time and a second time;
stop the transfer of the first portion of the first charge at a third time; start the transfer of the second portion of the first charge at the third time; and
determine a timing of the second infra-red light pulse based on a quantity of the first portion of the first charge, a quantity of the second portion of the first charge, and the third time.

9. The apparatus of claim 8, wherein the controller is configured to:
determine a timing of the first infra-red light pulse based on at least one of the first time or the second time; and
determine a timing relationship between the first infra-red light pulse and the second infra-red light pulse based on the timing of the first infra-red light pulse and the timing of the second infra-red light pulse;
and
wherein the 3D sensing operation is based on the timing relationship between the first infra-red light pulse and the second infra-red light pulse.

10. The apparatus of claim 9, wherein the timing relationship between the first infra-red light pulse and the second infra-red light pulse is determined based on a width of the first infra-red light pulse or a width of the second infra-red light pulse.

11. The apparatus of claim 8, wherein the third time is based on the second time.

12. The apparatus of claim 8, further comprising a third charge sensing unit;
wherein the controller is configured to:
prior to the infra-red illuminator transmitting the first infra-red light pulse, transfer a third portion of the first charge to the third charge sensing unit;
measure, based on the third portion of the first charge, an ambient infra-red light; and
determine the timing of the second infra-red light pulse based on a first difference between the first portion of the first charge and the third portion of the first charge and based on a second difference between the second portion of the first charge and the third portion of the first charge.

13. The apparatus of claim 12, wherein the controller is configured to reset the first photodiode after the transfer of the first charge out of the first photodiode.

14. The apparatus of claim 13, wherein the second photodiode is configured to generate the second charge based on detecting visible light; and
wherein the controller is configured to:
transfer the second charge from the second photodiode to the second charge sensing unit via the reset first photodiode.

15. The apparatus of claim 14, wherein the controller is configured to obtain the third measurement result of the visible light based on the second charge and a first infra-red crosstalk component introduced by the second infra-red light pulse, the first infra-red crosstalk component being based on the first charge and a ratio between a spectral response of the first photodiode and a spectral response of the second photodiode within a frequency range of the first infra-red light pulse.

16. The apparatus of claim 15, wherein the controller is configured to generate the measurement of the visible light based on a second infra-red crosstalk component introduced by the ambient infra-red light.

17. The apparatus of claim 16, wherein the first infra-red crosstalk component and the second infra-red crosstalk component are determined based on a width of the first infra-red light pulse and an integration period in which the second photodiode generates the second charge in response to the visible light.

18. The apparatus of claim 1, wherein the first charge sensing unit comprises a floating drain; and
wherein the second charge sensing unit comprises a second floating drain.

19. The apparatus of claim 1, wherein the 3D sensing operation comprises an indirect time-of-flight measurement operation.

20. A method comprising:
enabling a first photodiode to generate a first charge;
enabling a second photodiode to generate a second charge, the first photodiode and the second photodiode being separated by a barrier layer;
transferring a first portion of the first charge from the first photodiode to a first charge sensing unit to obtain a first measurement result;
transferring a second portion of the first charge from the first photodiode to a second charge sensing unit to obtain a second measurement result;
performing a 3D sensing operation based on the first measurement result and the second measurement result;
transferring the second charge from the second photodiode to the second charge sensing unit via the barrier layer and the first photodiode to obtain a third measurement result; and
performing a 2D sensing operation based on the third measurement result.

21. The method of claim 20, further comprising:
controlling an infra-red illuminator to transmit a first infra-red light pulse between a first time and a second time;
enabling the first photodiode to generate the first charge based on detecting a second infra-red light pulse from reflection of the first infra-red light pulse within an integration period;
stopping the transfer of the first portion of the first charge at a third time;
starting the transfer of the second portion of the first charge at the third time; and
determining a timing of the second infra-red light pulse based on a quantity of the first portion of the first charge, a quantity of the second portion of the first charge, and the third time.

22. The method of claim 21, further comprising:
determine a timing of the first infra-red light pulse based on at least one of the first time or the second time; and
determine a timing relationship between the first infra-red light pulse and the second infra-red light pulse based on the timing of the first infra-red light pulse and the timing of the second infra-red light pulse, and
wherein the 3D sensing operation is based on the timing relationship between the first infra-red light pulse and the second infra-red light pulse.

23. The method of claim 22, further comprising:
prior to the infra-red illuminator transmitting the first infra-red light pulse, transferring a third portion of the first charge from the first photodiode to a third charge sensing unit, the third portion of the first charge being generated by the first photodiode in response to an ambient infra-red light; and
determining the timing of the second infra-red light pulse based on a first difference between the first portion of the first charge and the third portion of the first charge and based on a second difference between the second portion of the first charge and the third portion of the first charge.

24. The method of claim 20, wherein the 3D sensing operation comprises an indirect time-of-flight measurement operation.

* * * * *